US012701744B2

(12) United States Patent
Chuang et al.

(10) Patent No.: US 12,701,744 B2
(45) Date of Patent: Aug. 4, 2026

(54) SEMICONDUCTOR DEVICE HAVING FRONT SIDE AND BACK SIDE SOURCE/DRAIN CONTACTS

(71) Applicant: Taiwan Semiconductor Manufacturing Co., Ltd., Hsinchu (TW)

(72) Inventors: Cheng-Chi Chuang, Hsinchu (TW); Li-Zhen Yu, Hsinchu (TW); Huan-Chieh Su, Hsinchu (TW); Chun-Yuan Chen, Hsinchu (TW); Lin-Yu Huang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 867 days.

(21) Appl. No.: 17/858,861

(22) Filed: Jul. 6, 2022

(65) Prior Publication Data

US 2023/0268403 A1 Aug. 24, 2023

Related U.S. Application Data

(60) Provisional application No. 63/312,751, filed on Feb. 22, 2022.

(51) Int. Cl.
*H10D 30/01* (2025.01)
*H10D 30/43* (2025.01)
(Continued)

(52) U.S. Cl.
CPC ....... *H10D 30/6729* (2025.01); *H10D 30/014* (2025.01); *H10D 30/031* (2025.01);
(Continued)

(58) Field of Classification Search
CPC ............. H10D 30/6729; H10D 30/014; H10D 30/031; H10D 30/43; H10D 30/6735;
(Continued)

(56) References Cited

U.S. PATENT DOCUMENTS

| 9,209,247 | B2 | 12/2015 | Colinge et al. |
| 9,236,267 | B2 | 1/2016 | De et al. |
| (Continued) | | | |

FOREIGN PATENT DOCUMENTS

| CN | 113140546 A | 7/2021 |
| TW | 202141687 A | 11/2021 |
| (Continued) | | |

*Primary Examiner* — William B Partridge
*Assistant Examiner* — Erik A. Anderson
(74) *Attorney, Agent, or Firm* — Seed IP Law Group

(57) ABSTRACT

A device includes semiconductor device structure includes a first dielectric layer. A first plurality of nanostructures are disposed on the first dielectric layer, with the first plurality of nanostructures overlying one another. A first source/drain region is disposed laterally adjacent to a first side of the first plurality of nanostructures. A second dielectric layer is on a first side of the first source/drain region. A front side source/drain contact is disposed on a second side of the first source/drain region that is opposite the first side, and a backside source/drain contact is disposed on the first side of the first source/drain region. The backside source/drain contact extends through the second dielectric layer.

16 Claims, 23 Drawing Sheets

(51) Int. Cl.

| | |
|---|---|
| *H10D 30/67* | (2025.01) |
| *H10D 62/10* | (2025.01) |
| *H10D 62/13* | (2025.01) |
| *H10D 64/01* | (2025.01) |
| *H10D 64/62* | (2025.01) |
| *H10P 14/20* | (2026.01) |

(52) U.S. Cl.
CPC ......... *H10D 30/43* (2025.01); *H10D 30/6735* (2025.01); *H10D 30/6757* (2025.01); *H10D 62/121* (2025.01); *H10D 62/151* (2025.01); *H10D 64/01* (2025.01); *H10D 64/62* (2025.01); *H10P 14/3462* (2026.01)

(58) Field of Classification Search
CPC ............. H10D 30/6757; H10D 62/121; H10D 62/151; H10D 64/01; H10D 64/62; H10D 30/797; H10D 62/364; H10D 64/518; H10D 62/126; H10D 64/017; H10D 64/251; H10D 84/0149; H10D 84/038; H10D 84/83; H10D 84/0158; H10D 84/834; H01L 21/02603; B82Y 10/00; H10P 14/3462
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,239,208 | B2 | 2/2022 | Chuang et al. |
| 11,502,223 | B1 * | 11/2022 | Atanackovic ........ H10H 20/815 |
| 2019/0273144 | A1 * | 9/2019 | Leobandung ........ H10D 30/014 |
| 2020/0357930 | A1 | 11/2020 | Glass et al. |
| 2021/0119031 | A1 | 4/2021 | Song et al. |
| 2021/0265348 | A1 | 8/2021 | Xie et al. |
| 2021/0335783 | A1 | 10/2021 | Chiu et al. |
| 2022/0028983 | A1 | 1/2022 | Fang et al. |
| 2022/0199797 | A1 | 6/2022 | Naskar et al. |
| 2022/0203367 | A1 * | 6/2022 | Ruggeri ............ B01L 3/502761 |
| 2023/0145229 | A1 * | 5/2023 | Thomas ............. H10D 84/0149 257/401 |
| 2023/0197569 | A1 * | 6/2023 | Dewey ................. H10D 62/118 257/401 |
| 2023/0197815 | A1 * | 6/2023 | Huang ................... H10D 84/83 257/288 |
| 2023/0207553 | A1 * | 6/2023 | Xie ..................... H10D 84/0149 |
| 2023/0207623 | A1 * | 6/2023 | Guler ................. H10D 30/0198 257/14 |

FOREIGN PATENT DOCUMENTS

| | | |
|---|---|---|
| TW | 202145363 A | 12/2021 |
| TW | 202145365 A | 12/2021 |

* cited by examiner

100

142
140
138
119
117
118
120
126

143

SEMICONDUCTOR DEVICE HAVING FRONT SIDE AND BACK SIDE SOURCE/DRAIN CONTACTS

BACKGROUND

There has been a continuous demand for increasing computing power in electronic devices including smart phones, tablets, desktop computers, laptop computers and many other kinds of electronic devices. Semiconductor devices provide the computing power for these electronic devices. One way to increase computing power in semiconductor devices is to increase the number of transistors and other semiconductor device features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowires, nanosheets, etc.) that act as the channel regions for a transistor. Gate electrodes may be coupled to the nanostructures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
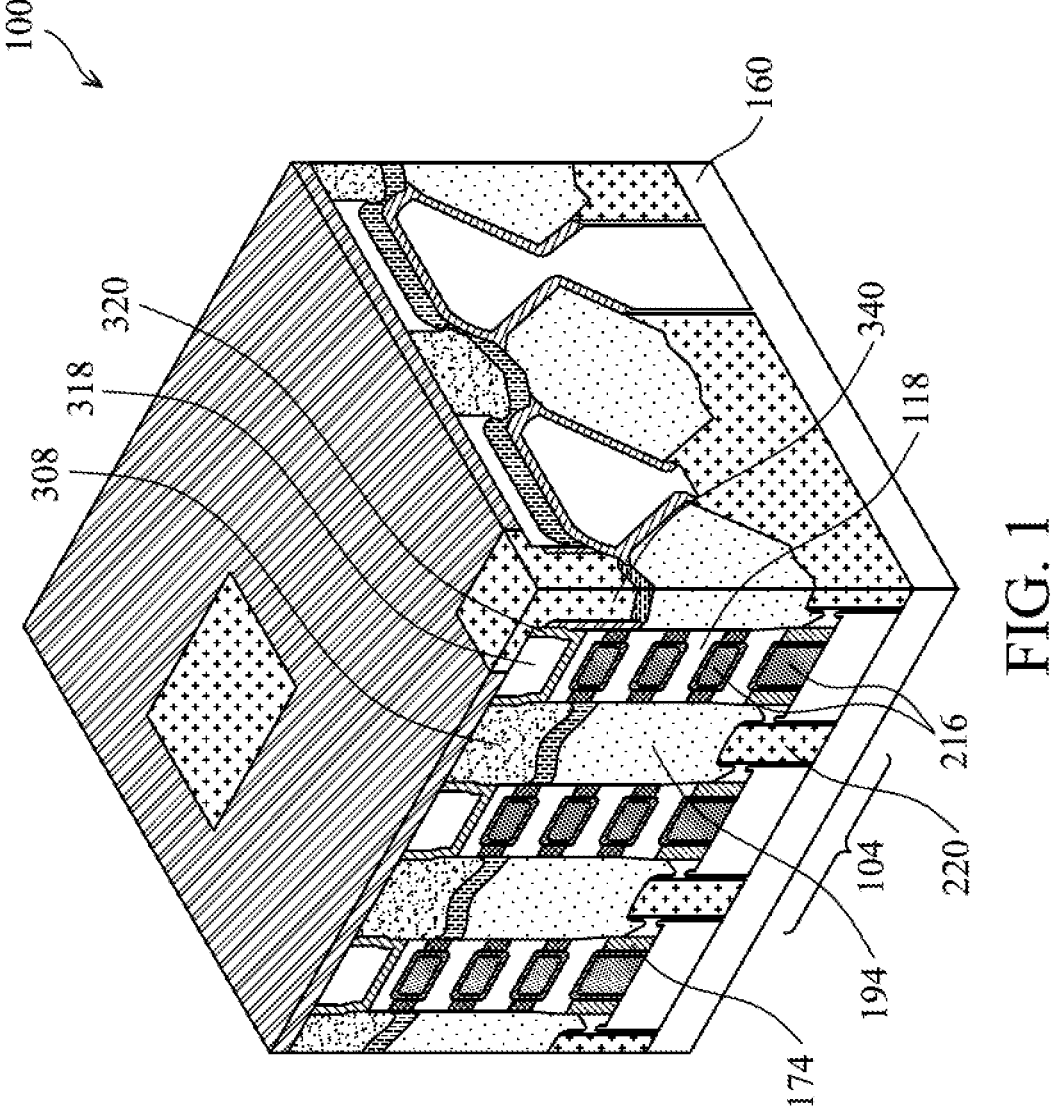
FIG. 1 is a perspective view of a semiconductor device, in accordance with some embodiments.

In the following description, many thicknesses and materials are described for various layers and structures within a semiconductor device die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide semiconductor devices and methods of manufacturing semiconductor devices that include backside self-aligned source/drain contacts which fully land on or contact epitaxial source/drain regions. Sacrificial dielectric structures or layers are formed on gate regions or on metal gate electrodes and which protect or otherwise reduce or prevent damage to the gate regions during formation of the backside source/drain contacts, for example, during an etching process which may be employed to form the backside source/drain contacts. The inclusion of the sacrificial dielectric structures facilitates enlarging of a patterning window or opening that is formed in a hard mask or other layer as part of the process of forming the backside source/drain contacts, as an etching process may be employed that selectively removes underlying portions of semiconductor regions while retaining the sacrificial dielectric structures.

FIG. 1 is a schematic diagram illustrating a semiconductor device 100, in accordance with some embodiments.

The semiconductor device 100 includes a plurality of transistors 104, which may be formed on a variety of structures. As set forth in more detail below, the semiconductor device 100 includes backside self-aligned source/drain contacts which fully land on or contact epitaxial source/drain regions. The device 100 includes sacrificial dielectric structures or layers which are formed on gate regions or on metal gate electrodes and which protect or otherwise reduce or prevent damage to the gate regions during formation of the backside source/drain contacts, for example, during an etching process which may be employed to form the backside source/drain contacts. The inclusion of the sacrificial dielectric structures facilitates enlarging of a patterning window or opening that is formed in a hard mask or other layer as part of the process of forming the backside source/drain contacts, as an etching process may be employed that selectively removes underlying portions of semiconductor regions while retaining the sacrificial dielectric structures.

The enlarged patterning window or opening, which is facilitated by the introduction of the sacrificial dielectric structures at the backside of the device 100, allows for formation of the backside source/drain contacts through the enlarged window or opening. This advantageously facilitates formation of the backside source/drain contacts in a self-aligned manner, which fully land on or contact epitaxial source/drain regions even in the event that the patterning window or opening is shifted with respect to a desired positioned. For example, the patterning window or opening may be formed slightly shifted with respect to a desired position due to overlay shift of photolithographic processes or tools utilized in forming the backside source/drain contacts; however, the enlarged patterning window or opening may have sufficiently enlarged dimensions to fully expose an upper surface of a semiconductor region overlying the epitaxial source/drain regions. The semiconductor region may thus be removed through the enlarged patterning window or opening, and the backside source/drain contacts may be formed to fully contact or land on the epitaxial source/drain regions. As such, the semiconductor device 100 may be formed have a greater tolerance for overlay shift than devices which do not include the sacrificial dielectric structures, as such devices may otherwise be damaged without very precise photolithographic overlay control during formation of the backside source/drain contacts. More specifically, overlay shift during formation of backside source/drain contacts in devices which do not include the sacrificial dielectric structures may cause damage to underlying structures such as the gate electrode or gate spacers, as such underlying structures may be undesirably exposed and the backside source/drain contacts may be formed in contact with these structures due to the overlay shift.

The transistors 104 include gate electrodes 216 which may be formed of any suitable electrically conductive material. In some embodiments, the gate electrodes 216 are formed of one or more of titanium (Ti), titanium nitride (TiN), or tungsten (W), and in some embodiments, the gate electrodes 216 may include one or more dopant materials, such as lanthanum (La), zirconium (Zr), or hafnium (Hf).

In some embodiments, a gate dielectric is disposed on the gate electrodes 216 and may surround (e.g., surround at least four sides) portions of the gate electrodes 216 disposed between the nanostructures 118 of each of the transistors. In various embodiments, the gate dielectric may be formed of a single layer or multiple dielectric layers.

In some embodiments, each of the plurality of transistors 104 are nanostructure transistors. In such embodiments, channel regions of each of the transistors 104 include a plurality of semiconductor nanostructures 118 extending between the source/drain regions 194 of the transistors 104.

The semiconductor nanostructures 118 may include nanosheets, nanowires, or other types of nanostructures. The semiconductor nanostructures 118 form channel regions of each of the transistors 104. Other types of transistors may be utilized without departing from the scope of the present disclosure. A number of the semiconductor nanostructures 118 included in the channel region of each transistor may vary in various embodiments. In some embodiments, the channel region of each transistor 104 may include one or more semiconductor nanostructures 118. In some embodiments, the channel region of each transistor 104 may include anywhere from one to five or more semiconductor nanostructures 118. The semiconductor nanostructures 118 of the channel region of each transistor 104 may be arranged in a stacked arrangement, such that the nanostructures 118 are substantially vertically aligned and overlapping with one another.

In some embodiments, the semiconductor device 100 includes a dielectric layer 160, and the semiconductor nanostructures 118 may be formed on the dielectric layer 160. A liner layer 320 may be disposed overlying the stacks of semiconductor nanostructures 118, and a sacrificial dielectric layer 318 is disposed on the liner layer 320. Front side source/drain contacts 220 are formed at one side of the source/drain regions 194 (e.g., the lower side) and backside source/drain contacts 340 are formed at an opposite side of the source/drain regions 194. The backside source/drain contacts 340 may extend through the sacrificial dielectric layer 318 and the liner layer 320, in some embodiments.

As will be described in further detail herein, the sacrificial dielectric layer 318 may be retained during an etching process, for example, to form the backside source/drain contacts 340, thereby enlarging a patterning window or opening in a hard mask or other layer as part of the process of forming the backside source/drain contacts, as an etching process may be employed that selectively removes underlying portions of semiconductor regions 308 while at least partially retaining the sacrificial dielectric layer 318.

Figure 2A:
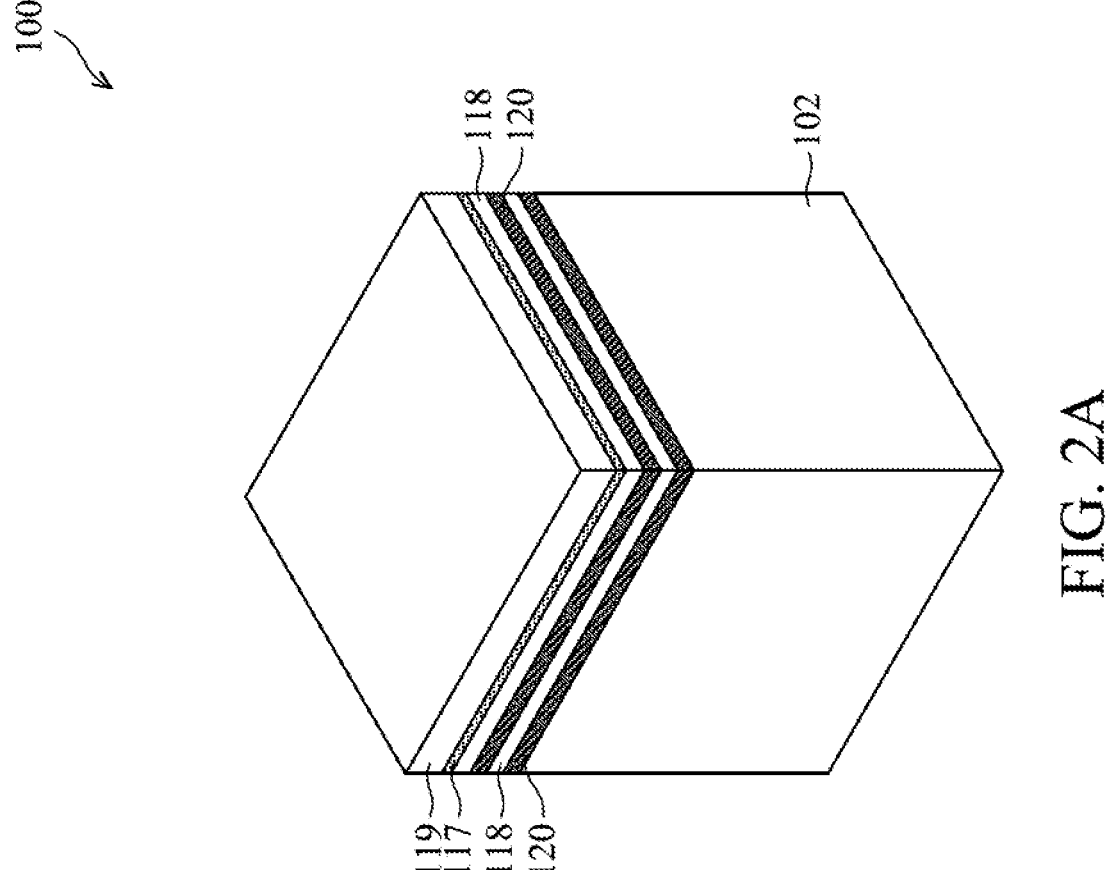
FIGS. 2A-2P are cross-sectional and perspective views of a semiconductor device at various stages of processing, in accordance with some embodiments.
Figure 2B:
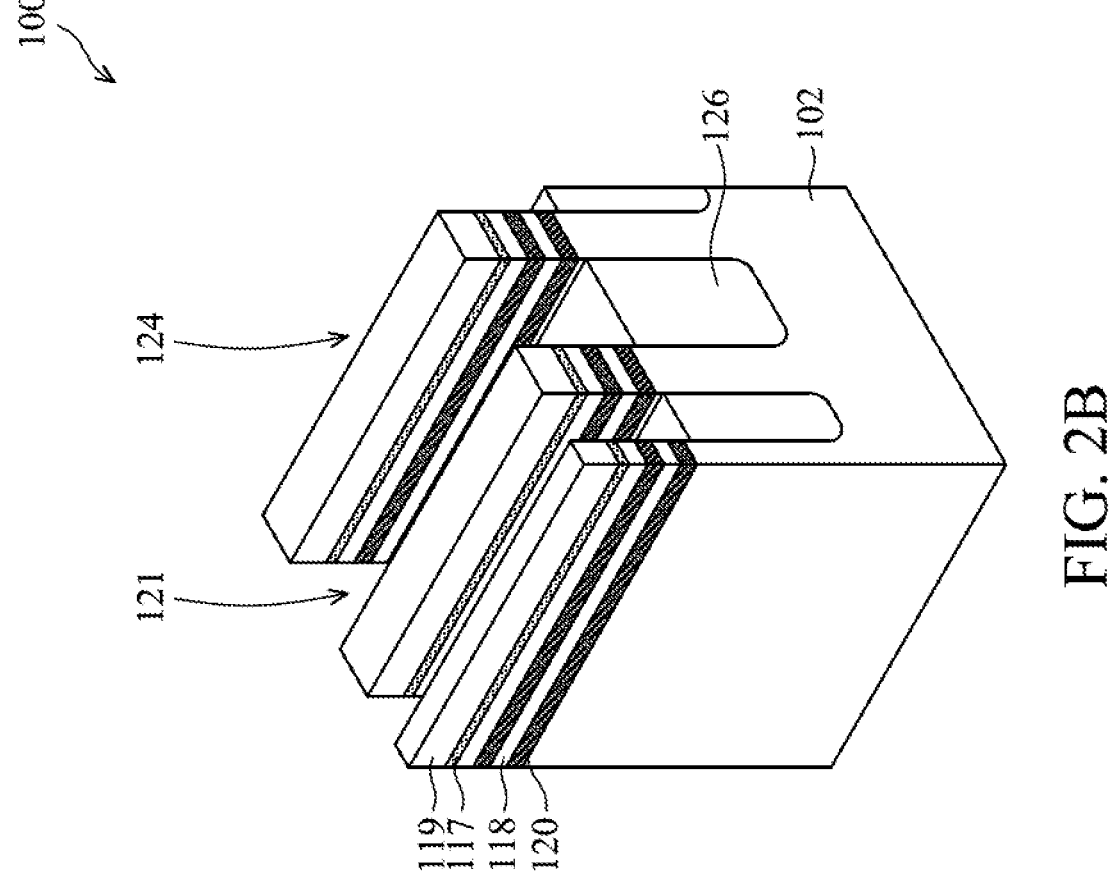
Figure 2C:
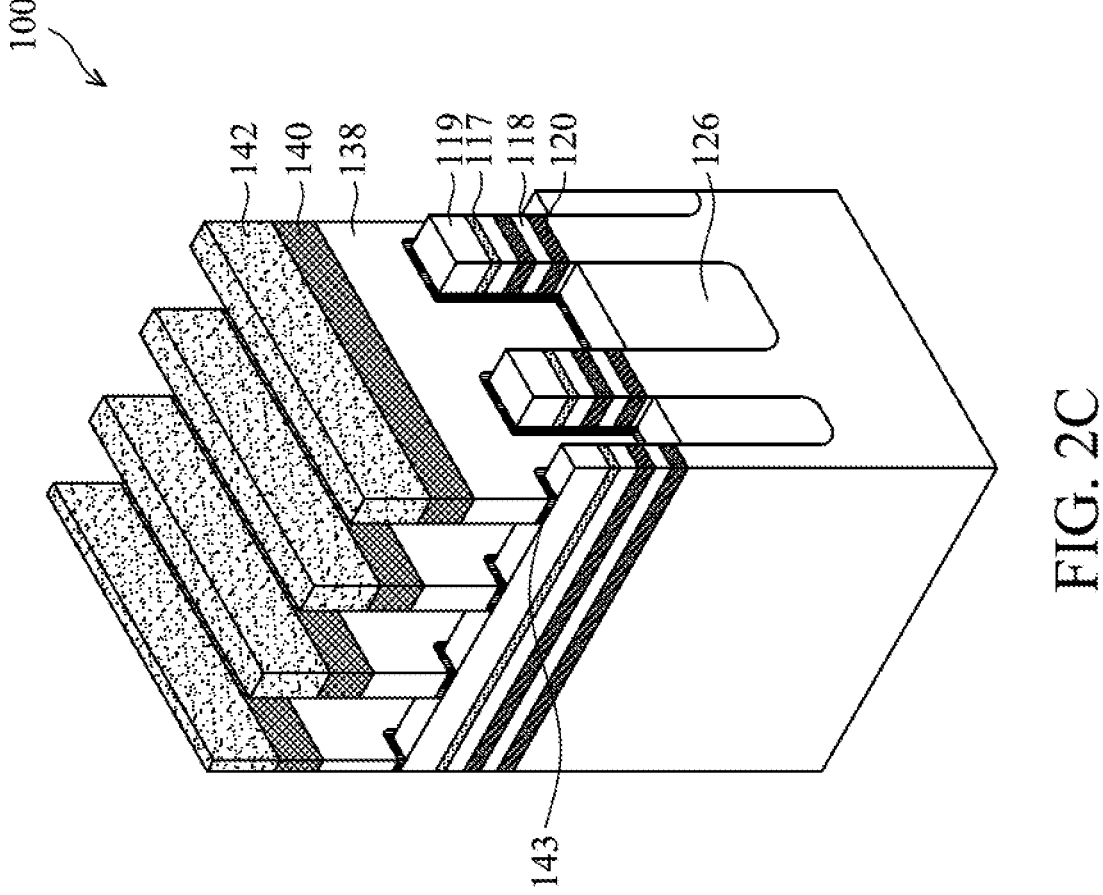
Figure 2D:
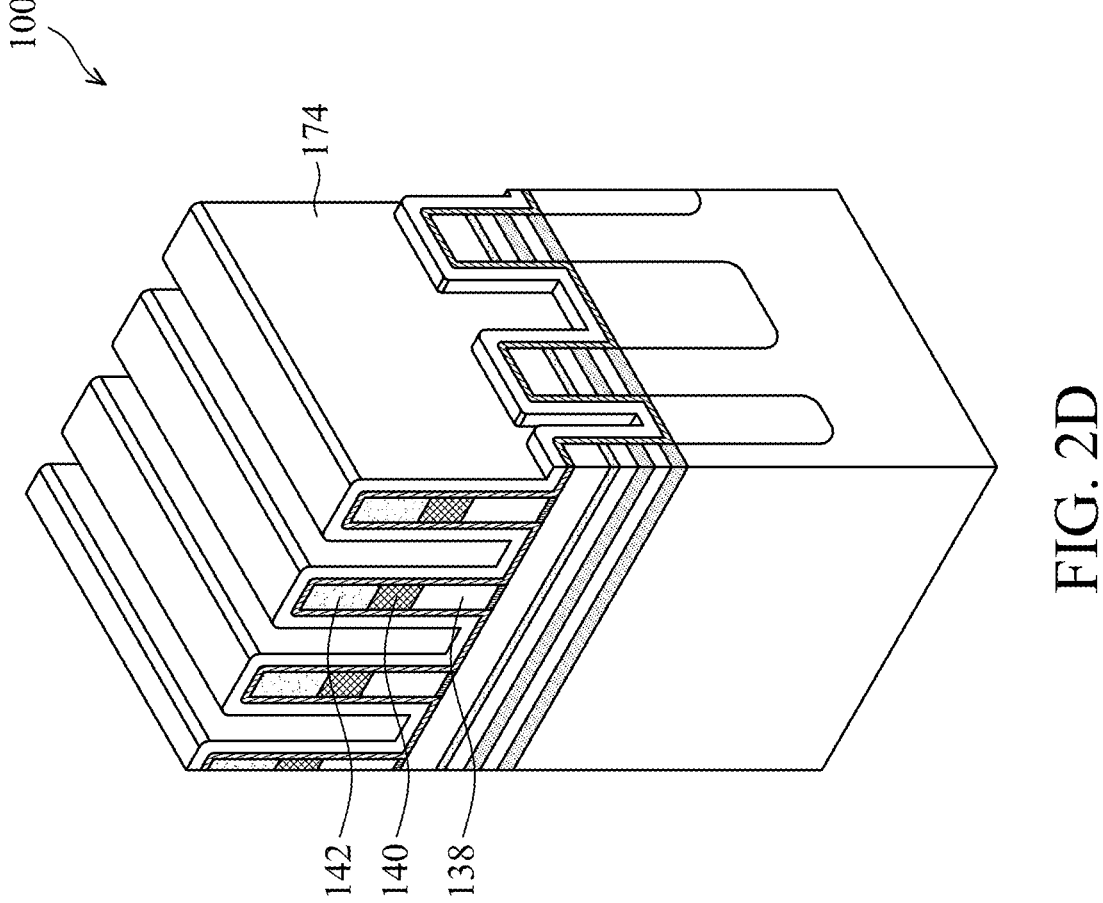
Figure 2E:
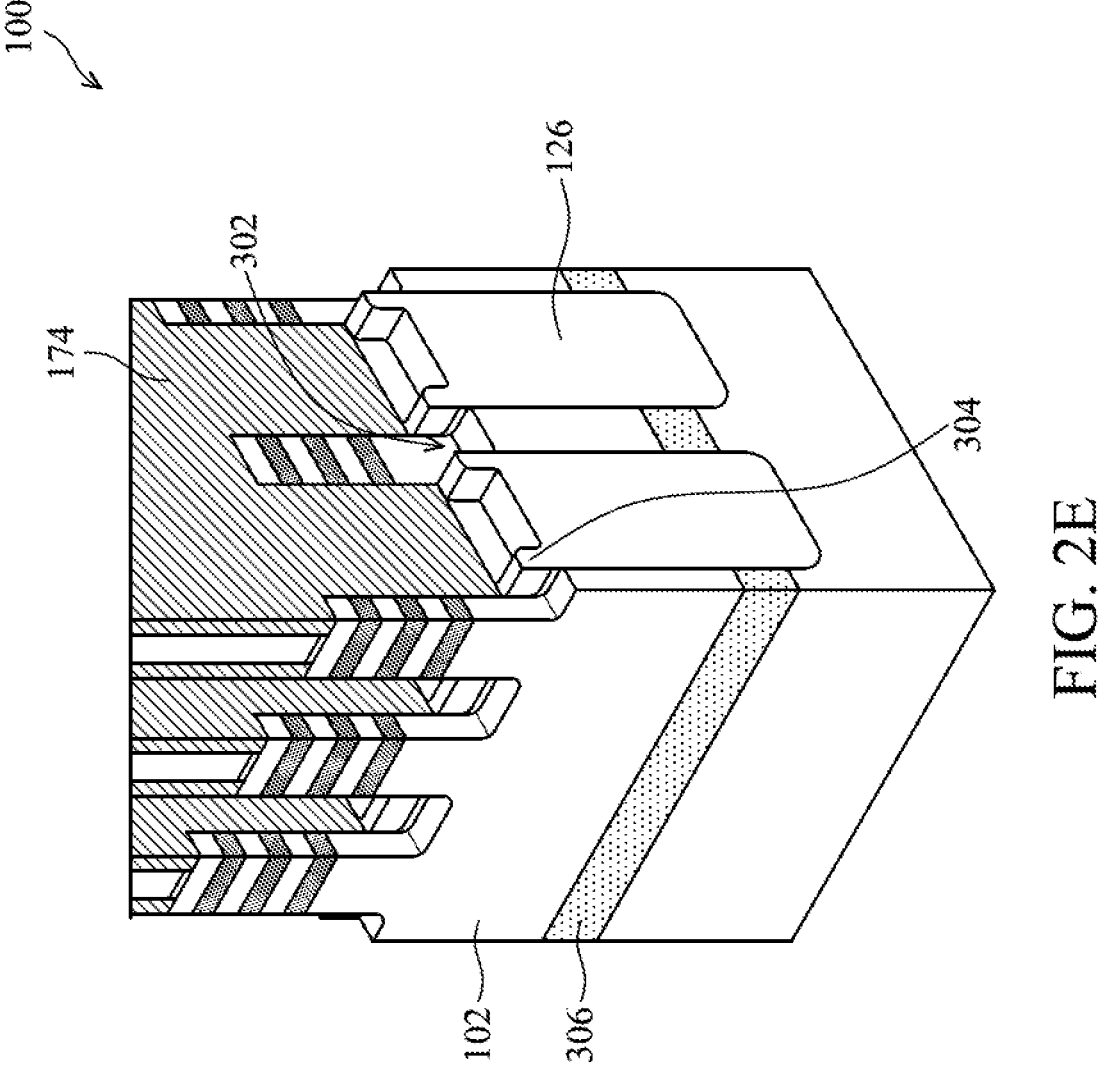
Figure 2F:
Figure 2F:
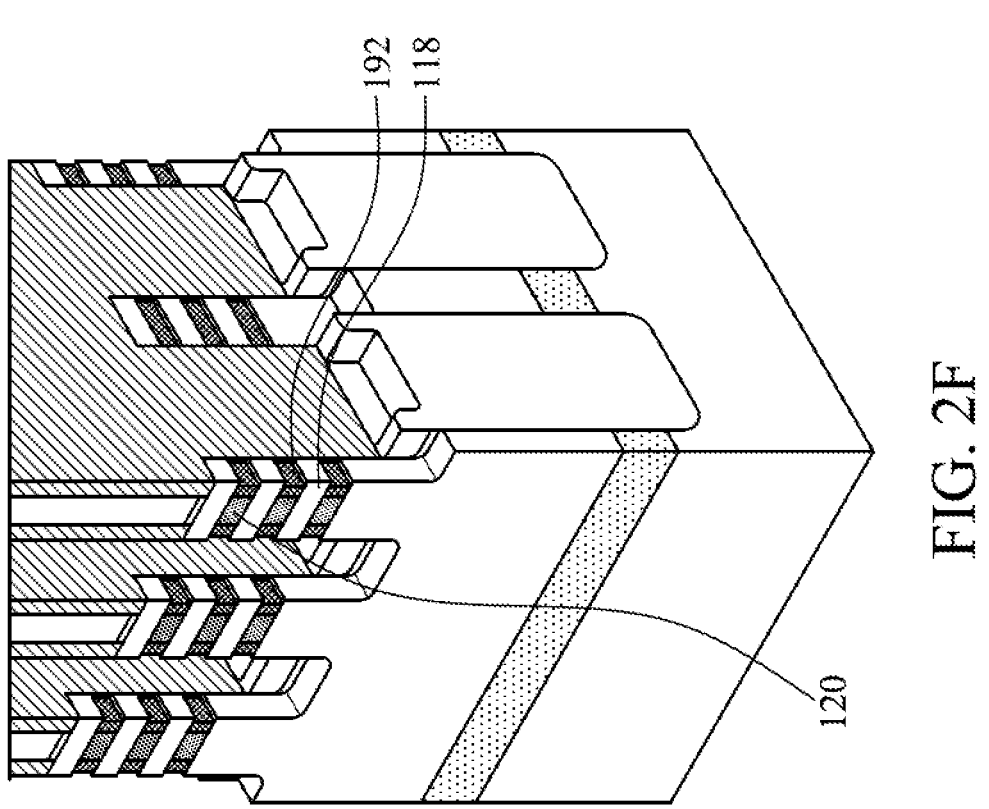
Figure 2G:
Figure 2G:
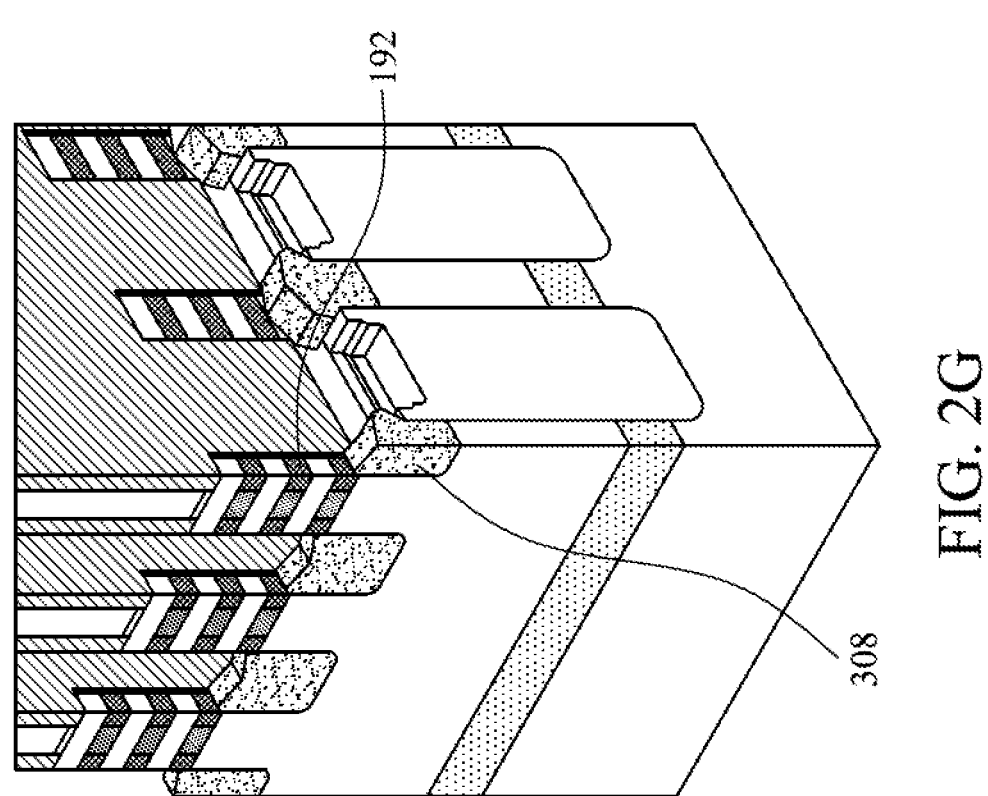
Figure 2H:
Figure 2H:
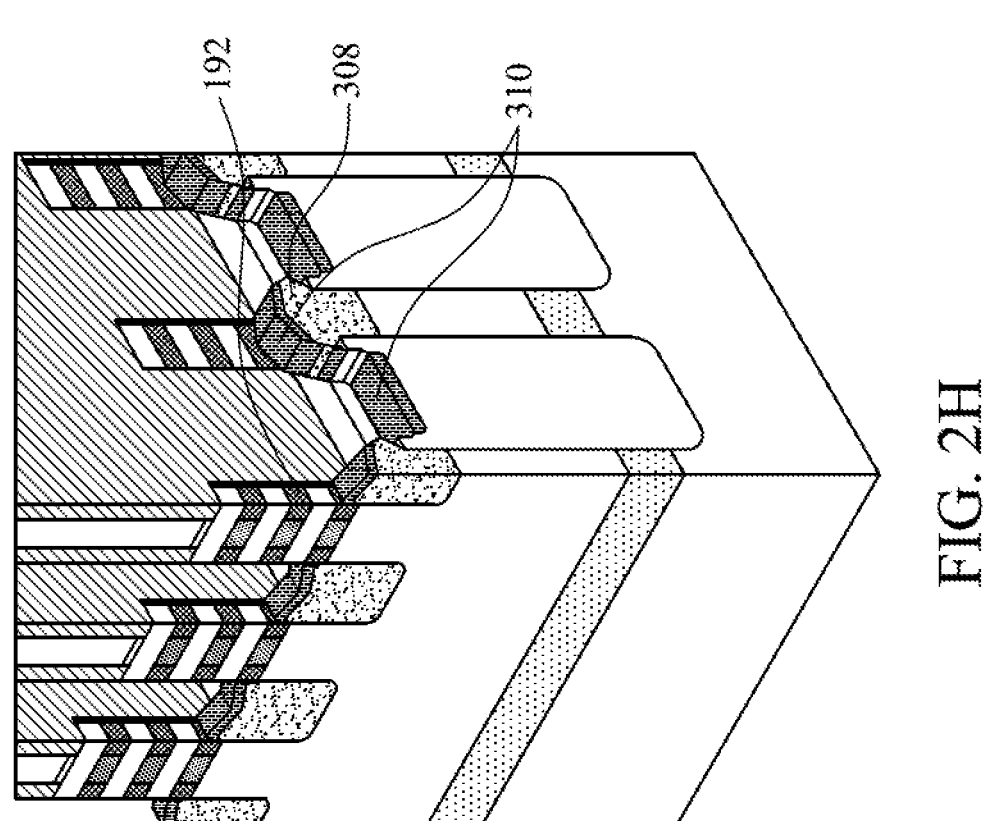
Figure 2I:
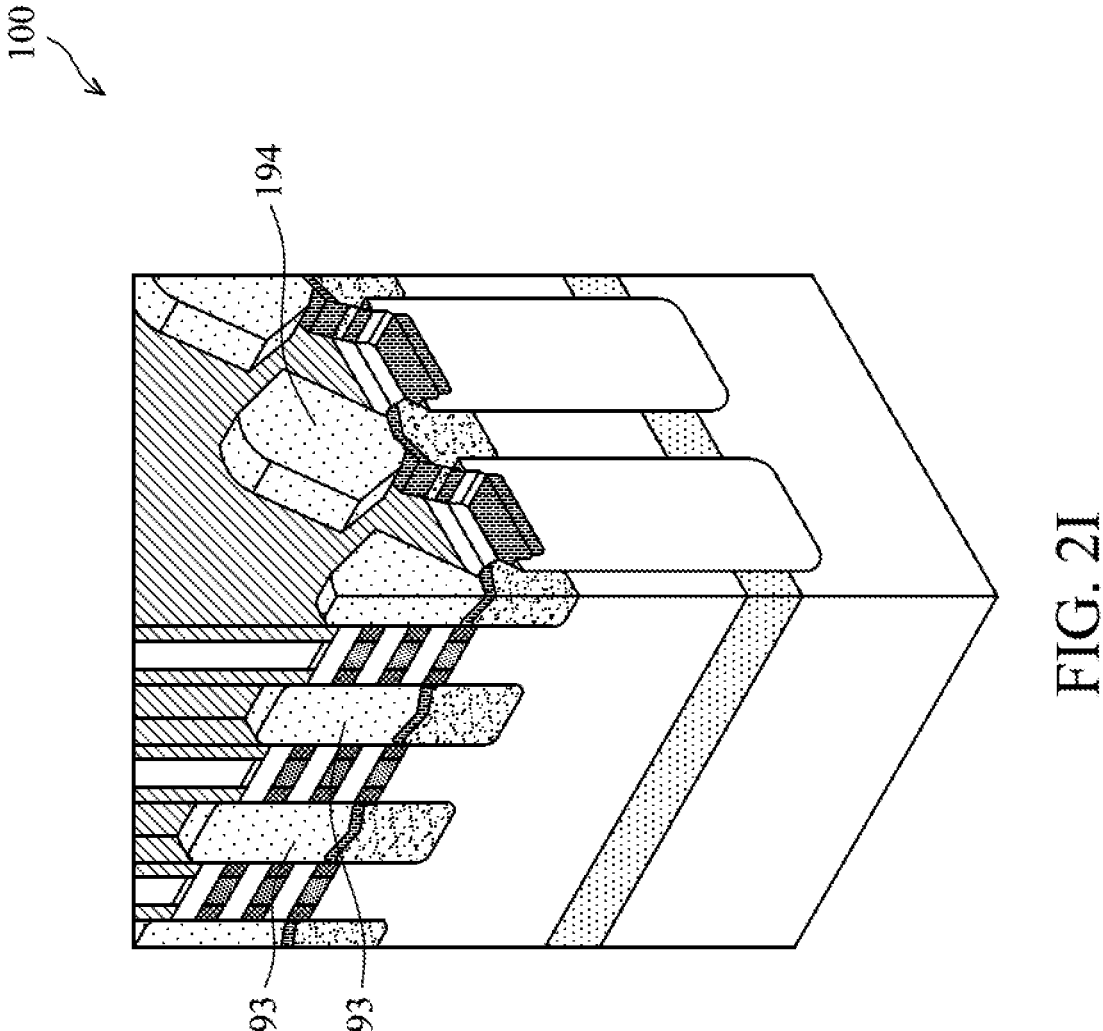
Figure 2J:
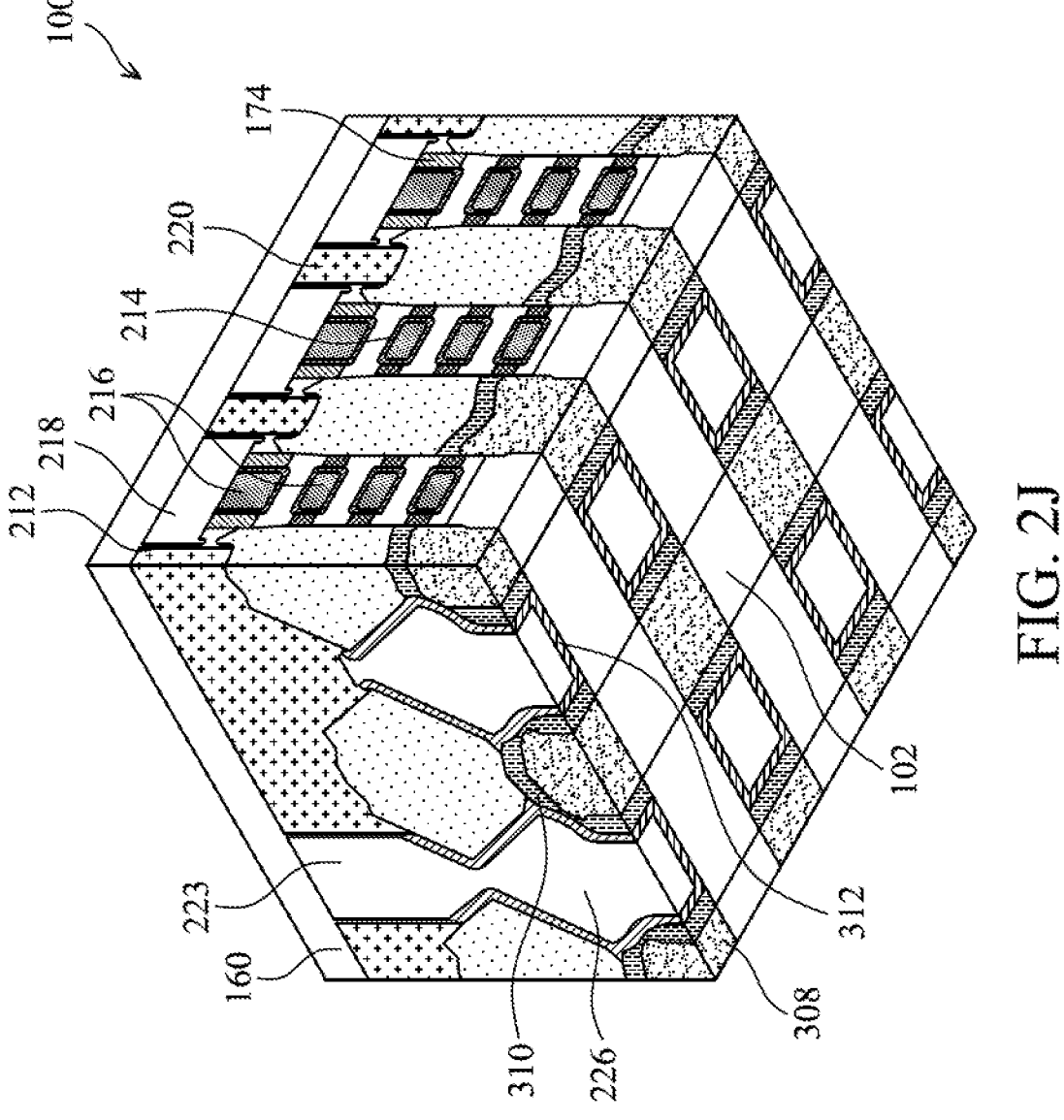
Figure 2K:
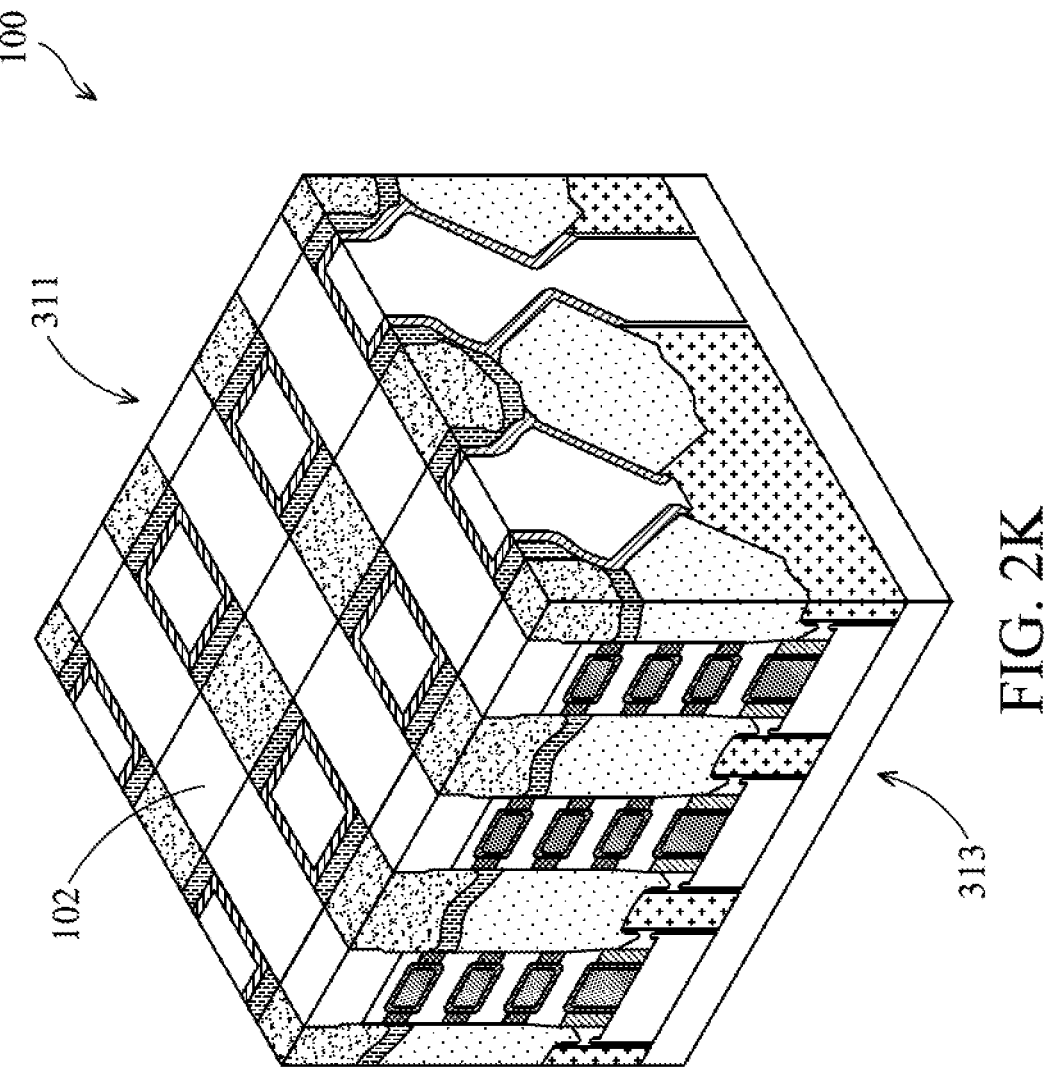
Figure 2L:
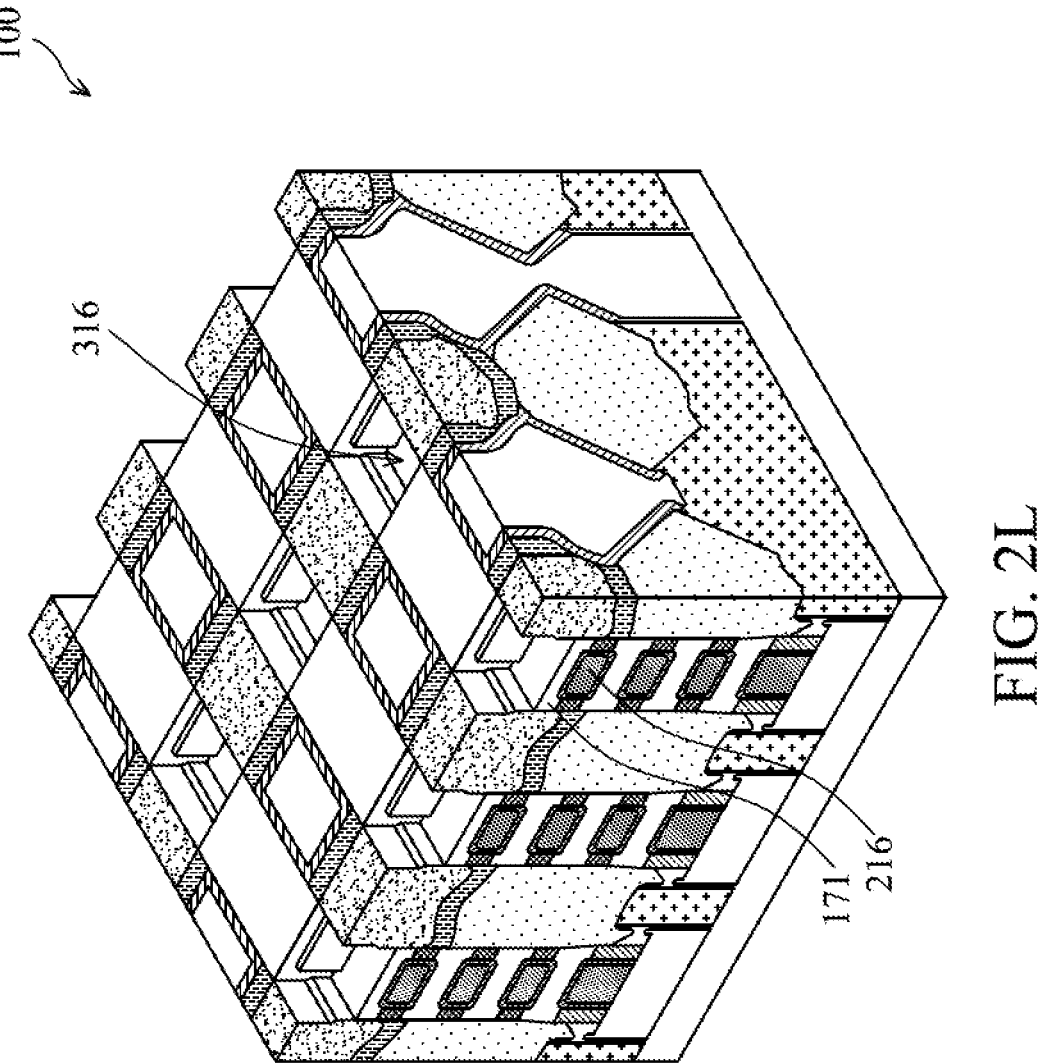
Figure 2M:
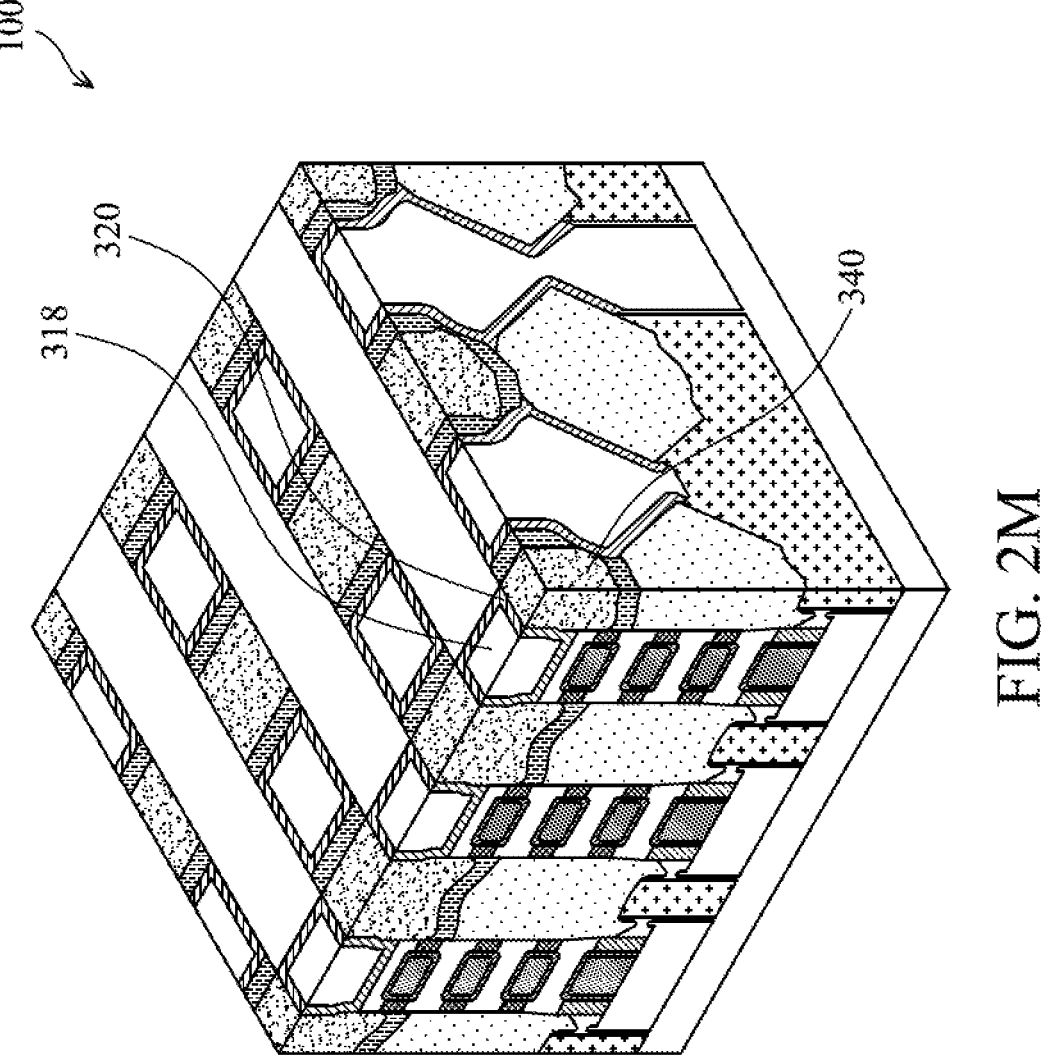
Figure 2N:
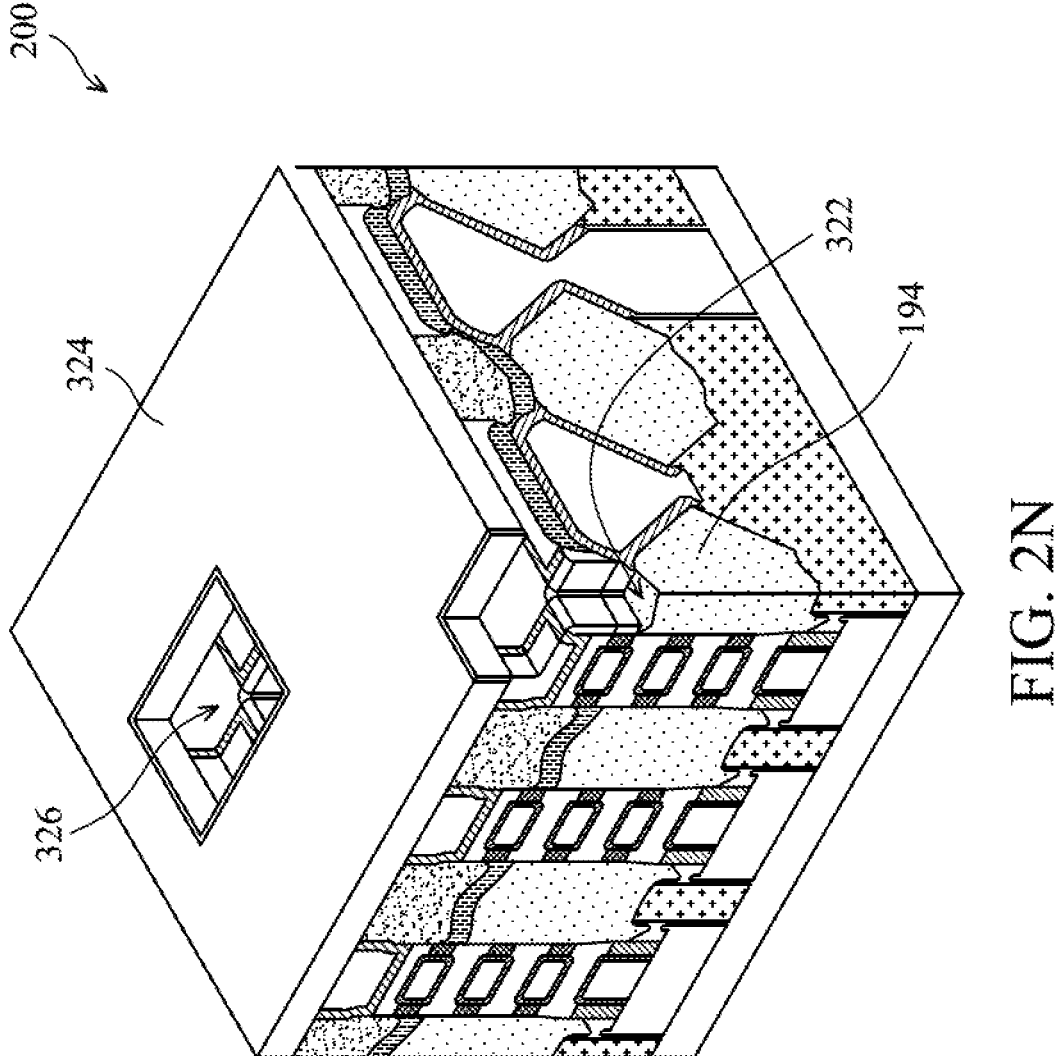
Figure 2O:
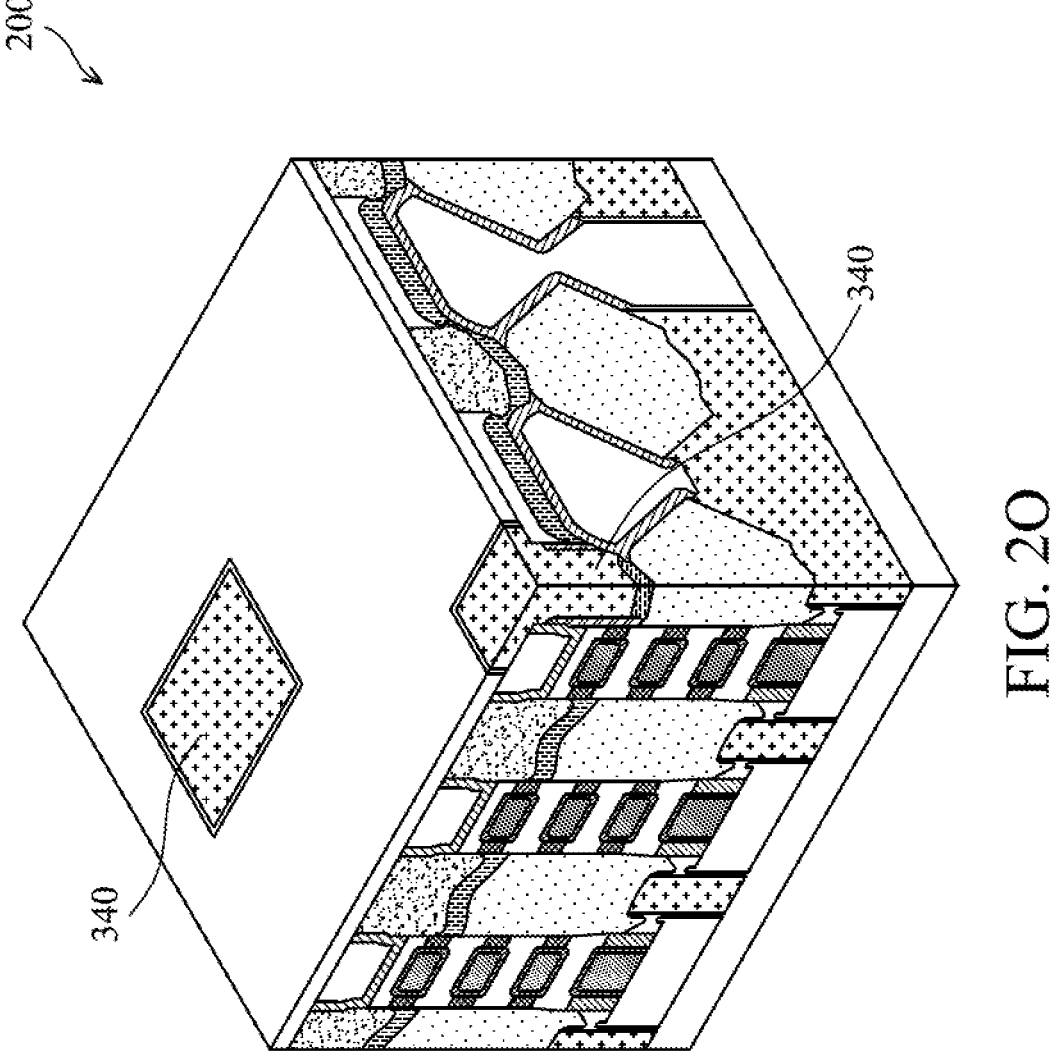
Figure 2P:
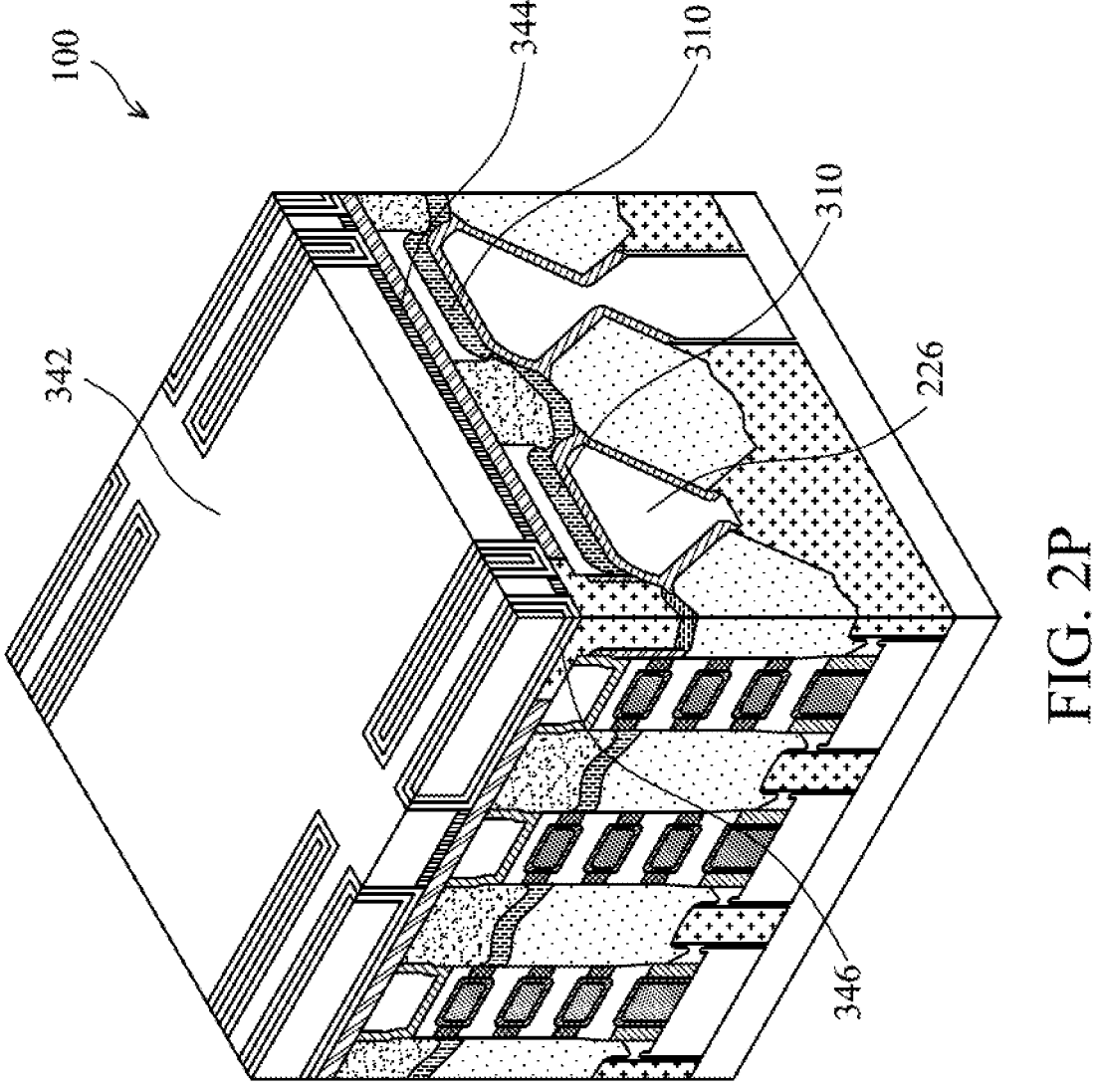

FIGS. 2A-2P are cross-sectional views of the semiconductor device 100 at various stages of processing, according to some embodiments. FIGS. 2A-2P illustrate an exemplary process for producing a semiconductor device that includes nanostructure transistors. FIGS. 2A-2P illustrate how these transistors can be formed in a simple and effective process in accordance with principles of the present disclosure. Other process steps and combinations of process steps can be utilized without departing from the scope of the present disclosure. The nanostructure transistors can include gate all around transistors, multi-bridge transistors, nanosheet transistors, nanowire transistors, or other types of nanostructure transistors.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

As shown in FIG. 2A, the semiconductor device 100 includes a semiconductor substrate 102. In some embodiments, the substrate 102 includes a semiconductor material. The semiconductor material may include a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants may include, for example, boron ($BF_2$) for an n-type transistor and phosphorus for a p-type transistor.

A plurality of semiconductor layers 118 are formed on the substrate 102. The semiconductor layers 118 are layers of semiconductor material. The semiconductor layers 118 correspond to the channel regions of the gate all around transistors that will result from the process described herein. The semiconductor layers 118 may be formed over the substrate 102. In various embodiments, the semiconductor layers 118 may include one or more layers of Si, Ge, SiGe, GaAs, InSb, GaP, GaSb, InAlAs, InGaAs, GaSbP, GaAsSb or InP. In some embodiments, the semiconductor layers 118 are formed of the same semiconductor material as the substrate 102. Other semiconductor materials can be utilized for the semiconductor layers 118 without departing from the scope of the present disclosure. In some embodiments, the semiconductor layers 118 are silicon layers and the substrate 102 is a silicon substrate.

A plurality of sacrificial semiconductor layers 120 are formed between the semiconductor layers 118. In some embodiments, the sacrificial semiconductor layers 120 include a different semiconductor material than the semiconductor layers 118. In an example in which the semiconductor layers 118 include silicon, the sacrificial semiconductor layers 120 may include SiGe. In one example, the silicon germanium sacrificial semiconductor layers 120 may include between 5% and 10% germanium, and in some embodiments between 20% and 30% germanium, though other concentrations of germanium can be utilized without departing from the scope of the present disclosure.

In some embodiments, the semiconductor layers 118 and the sacrificial semiconductor layers 120 are formed by alternating epitaxial growth processes from the semiconductor substrate 102. For example, a first epitaxial growth process may result in the formation of the lowest sacrificial semiconductor layer 120 on the top surface of the substrate 102. A second epitaxial growth process may result in the formation of the lowest semiconductor layer 118 on the top surface of the lowest sacrificial semiconductor layer 120. A third epitaxial growth process results in the formation of the second lowest sacrificial semiconductor layer 120 on top of the lowest semiconductor layer 118. Alternating epitaxial growth processes are performed until a selected number of semiconductor layers 118 and sacrificial semiconductor layers 120 have been formed.

In some embodiments, the vertical thickness of the semiconductor layers 118 may be between 2 nm and 15 nm. Similarly, in some embodiments, the vertical thickness of the sacrificial semiconductor layers 120 may be between 5 nm and 15 nm. Other thicknesses and materials can be utilized for the semiconductor layers 118 and the sacrificial semiconductor layers 120 without departing from the scope of the present disclosure.

As will be set forth in more detail below, the sacrificial semiconductor layers 120 will be patterned to become semiconductor nanostructures of gate all around transistors. The semiconductor nanostructures will correspond to channel regions of the gate all around transistors.

In one embodiment, the sacrificial semiconductor layers 120 correspond to a first sacrificial epitaxial semiconductor region having a first semiconductor composition. In subsequent steps, the sacrificial semiconductor layers 120 will be removed and replaced with other materials and structures. For this reason, the semiconductor layers 120 are described as sacrificial.

In some embodiments, an oxide layer 117 may be formed on an uppermost one of the semiconductor layers 118, for example, as shown in FIG. 2A. However, it is noted that in some embodiments, the oxide layer 117 is not formed or may instead be another semiconductor layer 118 of a stack of semiconductor layers. Any number of semiconductor layers 118 may be formed in accordance with various embodiments. In some embodiments, the oxide layer 117 may be formed of any oxide material. In some embodiments, the oxide layer 117 includes silicon oxide. The oxide layer 117 may have any suitable thickness. In some embodiments, the thickness of the oxide layer 117 is less than 50 nm. In some embodiments, the thickness of the oxide layer 117 is less than 20 nm. In some embodiments, the thickness of the oxide layer 117 is between 1 nm and 5 nm.

An upper semiconductor layer 119 is formed on the oxide layer 117. The upper semiconductor layer 119 may be formed of any suitable semiconductor material. In some embodiments, the upper semiconductor layer 119 is formed of a same material as the semiconductor layers 118 or the substrate 102. Other semiconductor materials can be utilized for the upper semiconductor layer 119 without departing from the scope of the present disclosure. In some embodiments, the upper semiconductor layer 119, the semiconductor layers 118, and the substrate 102 are formed of silicon.

As shown in FIG. 2B, trenches 121 are formed in the structure shown in FIG. 2A. More particularly, the trenches 121 are formed to extend through the upper semiconductor layer 119, the oxide layer 117, the semiconductor layers 118, the sacrificial semiconductor layers 120, and at least partially into the substrate 102. The trenches 121 may be formed by any suitable technique, including, for example, by patterning and etching the trenches. In some embodiments, the trenches 121 may be formed by depositing a hard mask layer (not shown) on the upper semiconductor layer 121 and patterning and etching the hard mask using standard photolithography processes. The hard mask layer may include one or more of aluminum, AlO, SiN, or other suitable materials. The hard mask layer may have a thickness between 5 nm and 50 nm, in some embodiments. The hard mask layer may be deposited by a PVD process, an ALD process, a CVD process, or other suitable deposition processes. The hard mask layer may have other thicknesses, materials, and deposition processes without departing from the scope of the present disclosure.

After the hard mask layer has been patterned and etched, the upper semiconductor layer 119, the oxide layer 117, the semiconductor layers 118, the sacrificial semiconductor layers 120, and the substrate 102 may be etched at the locations that are not covered by the hard mask layer. The etching process results in formation of the trenches 121. The etching process can include multiple etching steps. For example, a first etching step may be implemented to etch the upper semiconductor layer 119. A second etching step may be implemented to etch the oxide layer 117. A third etching step may be implemented to etch the top semiconductor layer 118, and a fourth etching step may be implemented to etch the top sacrificial semiconductor layer 120. The etching steps may be alternately performed until the upper semiconductor layer 119, the oxide layer 117, the semiconductor layers 118, the sacrificial semiconductor layers 120, and the substrate 102 have been suitably etched at the exposed regions. In other embodiments, the trenches 121 may be formed in a single etching process.

The trenches 121 define a plurality of fins 124, each of which includes respective portions of the upper semiconductor layer 119, the oxide layer 117, the semiconductor layers 118, and the sacrificial semiconductor layers 120. Each of the fins 124 corresponds to a separate gate all around transistor that will eventually result from further processing steps described herein. In particular, the semiconductor layers 118 in each column or stack will correspond to the channel regions of a particular gate all around nanosheet transistor.

While FIG. 2B illustrates the formation of three fins 124, it will be readily appreciated that in various embodiments, fewer or more than three fins 124 may be formed in the semiconductor device 100.

As shown in FIG. 2B, shallow trench isolation structures 126 are formed in the trenches 121. The shallow trench isolation structures 126 may be formed by any suitable technique. In some embodiments, the shallow trench isolation structures 126 may be formed by depositing a dielectric material in the trenches 121 and by recessing the deposited dielectric material so that a top surface of the dielectric material is below a level of the lowest sacrificial semiconductor layer 120. The hard mask may be removed, for example, after formation of the shallow trench isolation structures 126.

The shallow trench isolation structures 126 may be utilized to separate individual transistors or groups of transistors formed in conjunction with the semiconductor substrate 102. The dielectric material for the shallow trench isolation structures 126 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation structures 126 without departing from the scope of the present disclosure.

As shown in FIG. 2C, a polysilicon layer 138 has been formed on the top surfaces of the upper semiconductor layer 119 and the shallow trench isolation structures 126. Moreover, the polysilicon layer 138 may extend at least partially into the trench and contact side surfaces of the upper semiconductor layer 119, the oxide layer 117, the semiconductor layers 118, and the sacrificial semiconductor layers 120. In some embodiments, the polysilicon layer 138 may have a thickness between 20 nm and 100 nm. The polysilicon layer 138 may be formed by any suitable technique, including, for example, by deposition, epitaxial growth, a CVD process, a physical vapor deposition (PVD) process, or an ALD process. Other thicknesses and processes can be used for forming the polysilicon layer 138 without departing from the scope of the present disclosure.

A dielectric layer 140 is formed on the polysilicon layer 138, and a dielectric layer 142 is formed on the dielectric layer 140. In one example, the dielectric layer 142 includes silicon nitride. In one example, the dielectric layer 140 includes silicon oxide. In some embodiments, the dielectric layers 140 and 142 may be deposited by CVD. In some embodiments, the dielectric layer 140 may have a thickness between 5 nm and 15 nm. In some embodiments, the dielectric layer 142 may have a thickness between 15 nm and 50 nm. Other thicknesses, materials, and deposition processes may be utilized for the dielectric layers 140 and 142 without departing from the scope of the present disclosure.

In some embodiments, the dielectric layers 140 and 142 may be patterned and etched to form a hard mask for the polysilicon layer 138. The dielectric layers 140 and 142 may be patterned and etched, for example, using standard photolithography processes. After the dielectric layers 140 and 142 have been patterned and etched to form the hard mask, the polysilicon layer 138 may be etched so that only the portions of the polysilicon layer 138 directly below the dielectric layers 140 and 142 remains.

In some embodiments, a thin dielectric layer 143 may be formed, e.g., by deposition or any other suitable technique, prior to formation of the polysilicon layer 138. In such embodiments, the thin dielectric layer 143 may be formed on the top surfaces of the upper semiconductor layer 119 and the shallow trench isolation structures 126, and the thin dielectric layer 143 may extend at least partially into the trench and contact side surfaces of the upper semiconductor layer 119, the oxide layer 117, the semiconductor layers 118, and the sacrificial semiconductor layers 120. The thin dielectric layer 143 may have a thickness between 1 nm and 5 nm, in some embodiments. In some embodiments, the thin dielectric layer 143 may include or be formed of silicon oxide. Other materials, deposition processes, and thicknesses may be utilized for the thin dielectric layer 143 without departing from the scope of the present disclosure.

As shown in FIG. 2D, a spacer 174 is formed on the structure of the semiconductor device 100 resulting from the process shown with respect to FIG. 2C. The spacer 174 may include one or more layers, for example, dielectric layers, and may be formed by any suitable technique, such as by deposition. The spacer 174 may be formed on and in contact with an upper surface of the dielectric layer 142, and on side surfaces of each of the dielectric layer 142, the dielectric layer 140, the polysilicon layer 138, and the thin dielectric layer 143. Moreover, the spacer 174 may extend over the upper surface of the upper semiconductor layer 119 and on side surfaces of the upper semiconductor layer 119, the oxide layer 117, the semiconductor layers 118, and the sacrificial semiconductor layers 118 in the trench 124. In some embodiments, the spacer 174 contacts an upper surface of the shallow trench isolation structure 126 in the trench 124.

The spacer 174 may be formed of any suitable dielectric material. In some embodiments, the spacer 174 is formed of a silicon-based low-K dielectric material. In some embodiments, the spacer 174 includes silicon (Si), oxygen (O), carbon (C) and nitrogen (N). In some embodiments, the spacer 174 is a silicon oxycarbonitride (SiOCN) layer. In some embodiments, the spacer 174 may be deposited by CVD, ALD, or other suitable processes. Other materials and processes can be utilized for the spacer 174 without departing from the scope of the present disclosure.

The spacer 174 may have a thickness of less than 50 nm in some embodiments. In some embodiments, the spacer 174 has a thickness that is less than 30 nm. In some embodiments, the spacer 174 has a thickness that is less than 10 nm. In some embodiments, the spacer 174 has a thickness between 1 nm and 5 nm.

As shown in FIG. 2E, source/drain recesses 302 are formed in the semiconductor device 100. The source/drain recesses 302 may be formed by any suitable technique, and in some embodiments, are formed by removing portions of one or more of the spacer 174, the semiconductor layers 118, 119, the sacrificial semiconductor layers 120, or the substrate 102. For example, portions of these layers and structures may be removed by one or more etching processes, or any suitable technique, including, for example, utilizing the dielectric layers 140 and 142 as a hard mask for etching the various layers.

In some embodiments, the shallow trench isolation structures 126 may include protrusions 304, which may be formed by any suitable technique. In some embodiments, the protrusions 304 are protruding portions of the shallow trench isolation structures 126 that may result from the formation of the source/drain recesses 302, such as, for example, different etching rates or directions of the shallow trench isolation structures 126 at or near the interface of the spacer 174 and the stack of alternating semiconductor layers 118, 119 and sacrificial semiconductor layers 120. In at least one embodiment, the protrusions 304 are present due to the spacer 174 located at the top of the shallow trench isolation 126. The presence of the spacer 174 at the top of the shallow trench isolation 126 isolates the portion of the shallow trench isolation structure 126 such that portions of the shallow trench isolation structure 126 under the spacer 174 remain after strained source/drain and shallow trench isolation etching. In some embodiments, more than one processing step may be utilized to form the protrusions 304. In some embodiments, the protrusions 304 are not formed. For example, the shallow trench isolation structures 126 may have a smooth or substantially planar surface.

As shown in FIG. 2E, in some embodiments, the device 100 may include a buried semiconductor layer 306, which may be on or in the substrate 102. For example, in some embodiments, the substrate 102 may include the buried semiconductor layer 306 as a region that extends between portions of the substrate 102 (e.g., between an upper layer and a lower layer of the substrate 102). In some embodiments, the buried semiconductor layer 306 is formed of a semiconductor material that is different from a semiconductor material of the substrate 102. For example, in some embodiments, the semiconductor substrate 102 may be a silicon substrate, and the buried semiconductor layer 306 may be a SiGe layer that is disposed between an upper layer and a lower layer of the silicon substrate 102.

As shown in FIG. 2F, inner spacers 192 are formed on lateral side surfaces of the sacrificial semiconductor layers 120 and between the semiconductor layers 118. The inner spacers 192 may be formed by any suitable technique. In some embodiments, the side surfaces of the sacrificial semiconductor layers 120 are laterally recessed, for example, by an etching process that forms lateral recesses in the sacrificial semiconductor layers 120 by selectively removing lateral side portions of the sacrificial semiconductor layers 120, while retaining the lateral side edges of the semiconductor layers 118. An inner spacer dielectric layer may then be formed on the recessed side surfaces of the sacrificial semiconductor layers 120 and on side surfaces of the semiconductor layers 118. The inner spacer dielectric layer may then be removed from the side surfaces of the semiconductor layers 118, while portions of the inner spacer dielectric layer remain in the lateral recesses, thus forming the inner spacers 192. The inner spacer dielectric layer may be removed by any suitable technique, such as by an etching process which may selectively etch the inner spacer dielectric layer.

The inner spacers 192 may be formed of any suitable material. In some embodiments, the inner spacers 192 are formed of a dielectric material. In some embodiments, the inner spacers 192 include silicon nitride.

As shown in FIG. 2G, semiconductor regions 308 may be formed on the substrate 102. The semiconductor regions 308 may be formed by any suitable technique, including, for example, by epitaxial growth or deposition of a semiconductor material. The semiconductor regions 308 may be formed of a semiconductor material that is different from a material of the substrate 102. In some embodiments, the semiconductor regions 308 are SiGe regions or layers that are formed on the substrate 102, which may be a silicon substrate. In some embodiments, the semiconductor regions 308 may include between 5% and 10% germanium, and in some embodiments between 20% and 30% germanium, though other concentrations of germanium can be utilized without departing from the scope of the present disclosure. In some embodiments, the semiconductor regions 308 are formed of a same material as the buried semiconductor layer 306. In some embodiments, the semiconductor regions 308 have a thickness within a range of 5 nm to 30 nm.

In some embodiments, the semiconductor regions 308 may be formed at least partially within the source/drain recesses 302.

As will be described in further detail later herein, the semiconductor regions 308 may improve etching selectivity in one or more subsequent processes. For example, the semiconductor regions 308 may be more readily removed by an etchant than surrounding portions of the sacrificial dielectric layer 318, thus substantially or completely exposing an upper surface of the underlying source/drain regions 194 so that backside source/drain contacts 340 may be formed landing completely on the source/drain regions 194. Moreover, the height of the backside source/drain contacts 340 may be based on or otherwise related to the height of the semiconductor regions 308. As such, the semiconductor regions 308 may be formed to have a particular height as may be desired based on design considerations for a desired height of the backside source/drain contacts 340.

As shown in FIG. 2H, a dielectric layer 310 may be formed on the device 100. The dielectric layer 310 may be formed by any suitable technique. In some embodiments, the dielectric layer 310 is formed by one or more of a deposition process, an etching process, a masking process, or any photolithographic process. The dielectric layer may be formed on upper surfaces of the shallow trench isolation structures 126 and on the semiconductor regions 308.

The dielectric layer 310 may be formed of any suitable dielectric material. In some embodiments, the dielectric layer 310 includes one or more of SiO, AlO, AlON, ZrO, HfO, TiO, ZrAlO, ZnO, SiN, SiOCN, or SiCN. Other materials can be utilized without departing from the scope of the present disclosure. In some embodiments, the dielectric layer 310 has a thickness within a range of 1 nm to 10 nm.

The dielectric layer 310 may advantageously insulate, isolate or otherwise protect the later formed source/drain regions of the device 100. For example, the dielectric layer 310 may be an insulating layer that functions as a barrier between portions of the source/drain regions and other layers or materials, such as the semiconductor regions 308 and the inner spacers 192. In some embodiments, the dielectric layer 310 contacts one or more of the inner spacers 192. In some embodiments, an upper surface of the dielectric layer 310 is coplanar or substantially coplanar with a corresponding upper surface of an inner spacer 192, for example, with the dielectric layer 310 contacting the inner spacer 192.

As shown in FIG. 2I, source/drain regions 194 are formed on the semiconductor regions 308. In some embodiments, the source/drain regions 194 contact the semiconductor regions 308 and may be disposed directly on the semiconductor regions 308. In some embodiments, for example, in which the dielectric layer 310 is included, the source/drain regions 194 may be separated from the semiconductor regions 308 by the dielectric layer 310.

The source/drain regions 194 include semiconductor material. In some embodiments, the source/drain regions 194 may be grown epitaxially, e.g., from the semiconductor layers 118 or the substrate 102. In embodiments where dielectric layer 310 is provided and source/drain regions 194 are grown epitaxially from semiconductor layers 118, a void 193 may be formed in the source/drain regions 194, e.g., in the bottom of source/drain regions 194, due to the epitaxially grown source/drain regions 194 being formed through a lateral merged process. The source/drain regions 194 can be doped with N-type dopants species in the case of N-type transistors. The source/drain regions 194 can be doped with P-type dopant species in the case of P-type transistors. The doping can be performed in-situ during the epitaxial growth.

The source/drain regions 194 may extend between and contact side surfaces of the semiconductor layers 118 of adjacent stacks of semiconductor nanostructures, and the adjacent stacks of semiconductor nanostructures may form channel regions of respective transistors.

As shown in FIG. 2J, the substrate 102, the buried semiconductor layer 306, the semiconductor regions 308, the shallow trench isolation structures 126, and the dielectric layer 310 may be at least partially removed by any suitable technique applied to the backside or underside of the structure of FIG. 2J, including, for example, by chemical mechanical polishing. However, embodiments are not limited thereto, and in various embodiments, one or more etching processes, one or more cutting or excising processes, or any other suitable process may be utilized to at least partially remove the various features or layers.

In some embodiments, isolation structures 226 are formed, for example, over the dielectric layer 310, and the shallow trench isolation structures 126 are substantially or entirely removed.

In some embodiments, a dielectric layer 312 is formed on the shallow trench isolation structures 126, and the isolation structures 226 are formed on the dielectric layer. The shallow trench isolation structures 126 may be removed. The dielectric layer 312 may be formed of any suitable material. In some embodiments, the dielectric layer 312 is a contact etch stop layer (CESL).

As shown in FIG. 2J, portions of the dielectric layer 310 may be removed. For example, the dielectric layer 310 may be removed so that only portions of the dielectric layer 310 on the semiconductor regions 308 remain.

Further, as shown in FIG. 2J, portions of the spacers 174 are removed, as well as corresponding materials disposed between the spacers 174. In some embodiments, the portions of the spacers 174 and the corresponding materials disposed between the spacers 174 are removed by a cutting process, which may include one or more of a dry etching process, a wet etching process, and a chemical mechanical planarization (CMP) process.

In some embodiments, the polysilicon layer 138, the dielectric layers 140, 142, 143, the oxide layer 117, and the upper semiconductor layer 119 are removed. Additionally, the sacrificial semiconductor layers 120 may be removed. The sacrificial semiconductor layers 120 can be removed with an etching process that selectively etches the sacrificial semiconductor layers 120 with respect to the material of the semiconductor layers 118. After the etching process, the semiconductor layers 118 are no longer covered by sacrificial semiconductor structures.

As shown in FIG. 2J, gate electrodes 216 are formed. In some embodiments, gate structures are formed which may include the gate electrodes 216 and one or more gate dielectric layers. For example, in some embodiments, a gate dielectric 214 is formed on the exposed surfaces of the semiconductor layers 118. The gate dielectric 214 is shown as only a single layer. However, in practice, the gate dielectric 214 may include multiple dielectric layers. For example, the gate dielectric 214 may include an interfacial dielectric layer that is in direct contact with the semiconductor layers 118. The gate dielectric 214 may include a high-K gate dielectric layer positioned on the interfacial dielectric layer. Together, the interfacial dielectric layer and the high-K gate dielectric layer form a gate dielectric 214 for the transistors of the semiconductor device 100.

The interfacial dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The interfacial dielectric layer can be formed by a thermal oxidation process, a chemical vapor deposition (CVD) process, or an atomic layer deposition (ALD) process. In some embodiments, the interfacial dielectric layer can have a thickness between 0.5 nm and 2 nm. Other materials, deposition processes, and thicknesses can be utilized for the interfacial dielectric layer without departing from the scope of the present disclosure.

The high-K gate dielectric layer and the interfacial dielectric layer physically separate the semiconductor layers 118 from the gate metals that will be deposited in subsequent steps. The high-K gate dielectric layer and the interfacial dielectric layer isolate the gate metals from the semiconductor layers 118 that correspond to the channel regions of the transistors.

The high-K gate dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. The high-K gate dielectric layer may be formed by CVD, ALD, or any suitable method. In one embodiment, the high-K gate dielectric layer is formed using a highly conformal deposition process such as ALD in order to ensure the formation of a gate dielectric layer having a uniform thickness around each semiconductor layer 118. In one embodiment, the thickness of the high-K dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes HfO$_2$ with dipole doping including La and Mg, and a second layer including a higher-K ZrO layer with crystallization.

After formation of the gate dielectric 214, e.g., by deposition, a gate metal is deposited. The gate metal forms the gate electrodes 216 around the semiconductor nanostructures or layers 118. The gate metal is in contact with the gate dielectric 214, in some embodiments. The gate metal is positioned between semiconductor layers 118. In other words, the gate metal is positioned all around the semiconductor nanostructures or layers 118. For this reason, the transistors of the semiconductor device 100, e.g., the first transistor 104, formed in relation to the semiconductor nanostructures 118 are called gate all around transistors.

Although the gate electrodes 216 are each shown as a single metal layer, in practice, the gate electrodes 216 may each include multiple metal layers. For example, the gate electrodes 216 may include one or more very thin work function layers in contact with the gate dielectric 214. The thin work function layers can include titanium nitride, tantalum nitride, or other conductive materials suitable for providing a selected work function for the transistors. The gate electrodes 216 can further include a gate fill material that corresponds to the majority of the gate electrodes 216. The gate fill material can include cobalt, tungsten, aluminum, or other suitable conductive materials. The layers of the gate electrodes 216 can be deposited by PVD, ALD, CVD, or other suitable deposition processes. In some embodiments, the gate electrodes 216 are formed of one or more of titanium (Ti), titanium nitride (TiN), or tungsten (W), and in some embodiments, the gate electrodes 216 may include one or more dopant materials, such as lanthanum (La), zirconium (Zr), or hafnium (Hf).

In some embodiments, a dielectric liner layer 212 may be formed, e.g., on or adjacent to exposed top portions of the gate electrodes 216. In some embodiments, a dielectric cap layer 218 is formed on the gate electrodes 216 or on the dielectric liner layer. Further, in some embodiments, the dielectric cap layer 218 may be formed on one or more portions of the sour/drain regions 194. The dielectric cap layer 218 may include silicon oxide or other suitable dielectric materials. The dielectric cap layer 218 may include a plurality of dielectric strips generally extending along a same direction and substantially parallel to one another. The dielectric strips may extend over the gate electrodes 216, the source/drain regions 194, and other structures of the device 100.

In some embodiments, a silicide layer may be formed on the top surfaces of the source/drain regions 194. The silicide layer may include titanium silicide, aluminum silicide, nickel silicide, tungsten silicide, or other suitable silicides.

Further, as shown in FIG. 2J, front side source/drain contacts 220 are formed on the source/drain regions 194, and in some embodiments, may be formed on any silicide layer which may be present on the source/drain regions 194. The source/drain contacts 220 can include a conductive material such as tungsten, titanium, aluminum, tantalum, or other suitable conductive materials.

Isolation structures, e.g., dielectric breakthroughs 223 may be inserted into the source/drain contacts 220 selectively in order to isolate some transistors from others. The dielectric breakthroughs 223 can include an oxide such as silicon oxide, a nitride such as silicon nitride, or other dielectric materials. In some embodiments, the dielectric breakthroughs 223 are formed over one or more of the isolation structures 226.

In some embodiments, one or more dielectric layers are formed over a side or surface of the device 100, such as on upper surfaces of the gate electrodes 216, the dielectric breakthroughs 223, and the source/drain contacts 220, as shown in FIG. 2J. In some embodiments, the dielectric layer 160 includes silicon oxide. However, the dielectric layer 160 can include silicon nitride, silicon oxynitride (SiON), SiOCN, SiCN, fluorine-doped silicate glass (FSG), a low-K dielectric material or other dielectric materials without departing from the scope of the present disclosure. In some embodiments the dielectric layer 160 is a multi-layer including a first dielectric layer and a second dielectric layer which may be formed of different materials, such as silicon oxide and silicon nitride.

In some embodiments, the dielectric layer 160 may be a hard mask layer.

As shown in FIG. 2K, the device 100 may be flipped so that a backside 311 of the device 100 is oriented upward as shown, while the front side 313 of the device is oriented downward. The device 100 may be flipped as part of a thin down process in which the backside 311 of the device is thinned down, for example, by removal of one or more features at the backside 311 of the device by any suitable thin down technique, including, for example, by chemical mechanical polishing. For example, as described above with reference to FIG. 2J, the substrate 102, the buried semiconductor layer 306, the semiconductor regions 308, the shallow trench isolation structures 126, and the dielectric layer 310 may be at least partially removed by any suitable technique, including, for example, by chemical mechanical polishing, which may be performed after the device 100 has been flipped, for example, after the front side source/drain contacts 220 have been formed as described with respect to FIG. 2J. In some embodiments, the device 100 is flipped as shown in FIG. 2K as part of or prior to the removal of features shown and described with respect to FIG. 2J, which may be performed as part of a thin down process.

As shown in FIG. 2L, recesses 316 are formed at the backside 311 of the device 100. The recesses 316 may be formed, for example, by removing portions of the substrate 102 that was disposed between adjacent semiconductor regions 308. The recesses 316 may be formed by any suitable technique, which may include one or more patterning, etching, deposition, or photolithographic processes.

In some embodiments, an etching process is performed to form the recesses 316. The etching process may include formation or use of one or more hard mask layers or photoresist layers, which may be patterned to form the recesses 316 by selectively etching and removing portions of the substrate 102.

In some embodiments, the recesses 316 are formed by removing the portions of the substrate 102 by an etching process. In some embodiments, the etching process is an isotropic process in which an etchant flow rate is provided within a range of 5 sccm to 200 sccm. In some embodiments, the etching process is performed in a chamber having a chamber pressure within a range of 1-100 mTorr, and a plasma power within a range of 50-250 W. In various embodiments, a pre-clean gas or an etching gas may be one or more of $H_2$, $CHF_3$, $CH_3F$, $CF_4$, $Cl_2$ or other gases or mixtures thereof. These etching parameters may advantageously facilitate selective removal of portions of the substrate 102 while retaining portions of neighboring components, such as portions of the semiconductor regions 308. In some embodiments, one or more parameters of the etching process, such as the etchant gas chemistry, may be selected to produce a high etching selectivity between the substrate 102 and the semiconductor regions 308. For example, an etchant gas or other etching parameters may be utilized which selectively removes a material (e.g., silicon) of the substrate 102 while retaining or otherwise not as actively removing the material (e.g., SiGe) of the semiconductor regions 308.

In some embodiments, a remaining portion 171 of the substrate 102 may remain at the bottom of the recesses 316, e.g., over gate electrodes 216. In some embodiments, the remaining portion 171 may have a thickness between 0.5 nm and 20 nm. In some embodiments, the remaining portion 171 have a thickness less than 0.5 nm and in other embodiments, layer 171 is not present.

As shown in FIG. 2M, a sacrificial dielectric layer 318 is formed in the recesses 316. In some embodiments, the sacrificial dielectric layer 318 may be formed on a liner layer 320, and the liner layer 320 may be formed directly on the semiconductor material of the transistors 104, such as on a channel region or the semiconductor layers 118. The liner layer 320 may be formed of any material, such as a dielectric material. In some embodiments, the liner layer 320 may be a silicon nitride layer.

The sacrificial dielectric layer 318 may be formed of any dielectric material, and in some embodiments, is formed of a different material than the liner layer 320. In some embodiments, the sacrificial dielectric layer 318 is an oxide layer. In some embodiments, the sacrificial dielectric layer 318 includes one or more of SiO, SiOC, AlO, AlON, ZrO, HfO, TiO, ZrAlO, ZnO, SiOCN, SiOCN, or SiCN. In some embodiments, the sacrificial dielectric layer 318 has a thickness within a range of 1 to 50 nm. In some embodiments, the sacrificial dielectric layer 318 has a thickness less than 20 nm. In some embodiments, the sacrificial dielectric layer 318 has a width that is within a range of 5 nm to 30 nm.

In some embodiments, a chemical mechanical polishing process is performed at the backside 311 of the device 100, for example, after deposition of the liner layer 320 and the sacrificial dielectric layer 318.

The sacrificial dielectric layer 318 may be formed of a material which produces high etching selectivity between the sacrificial dielectric layer 318 and the semiconductor regions 308 (which may be SiGe in some embodiments).

As shown in FIG. 2N, recesses 322 are formed at the backside 311 of the device 100. In some embodiments, a hard mask layer 324 is formed on the backside of the device 100, and the hard mask layer 324 may be patterned, for example, by a photolithography process. In some embodiments, a photoresist layer (not shown) may be formed on the hard mask layer 324. The photoresist layer may be patterned by a photolithography process, and an etching processes may be performed to etch the hard mask layer 324 in the pattern of the photoresist layer. The hard mask layer 324 can include a dielectric material, a metal, or another type of material. In some embodiments, the hard mask layer 324 includes one or more of SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, or SiCN. In some embodiments, the hard mask layer 324 has a thickness within a range of 5 nm to 40 nm.

The hard mask layer 324 may be patterned to form openings 326 which extend through the hard mask layer 324. The recesses 322 may be formed, for example, in an etching process in which the hard mask layer 324 protects underlying of the device 100, while the etchant is permitted to remove exposed portions of the device 100 through the openings 326.

For example, in some embodiments, the recesses 322 are formed by at least partially removing one or more semiconductor regions 308 that are exposed through the openings 326. In some embodiments, an etching process is utilized which has a high selectivity of the material of the semiconductor regions 308 (e.g., SiGe) with respect to a material of the sacrificial dielectric layer 318 (e.g., oxide) or the sacrificial liner 320 (e.g., SiN). As such, the etching process can selectively etch or remove the exposed semiconductor regions 308 while retaining exposed portions of the sacrificial dielectric layer 318 or the sacrificial liner 320.

One or more of the source/drain regions 194 are exposed by the recesses 322, as shown.

As shown in FIG. 2O, backside source/drain contacts 340 have been formed in the openings 326 and may extend into and partially or fully fill the recesses 322. The backside source/drain contacts 340 can include the same material as the source/drain contacts 220. Alternatively, the source/drain contacts 340 can have a different material, such as a different conductive material than the material used for the source/drain contacts 220. In some embodiments, the backside source/drain contacts 340 include one or more of W, Ru, Co, Cu, Ti, TiN, Ta, TaN, Mo, and Ni. In some embodiments, the backside source/drain contacts 340 may have thickness that is within a range of 1 nm to 50 nm.

In some embodiments, a silicide layer may be formed or otherwise disposed between the source/drain contacts 340 and the source/drain regions 194. The backside source/drain contacts 340 may be electrically coupled to one or more of the source/drain regions 194.

In some embodiments, a dielectric liner 181 (see FIG. 3B) may be formed in the recesses 322 and the source/drain contacts 340 may be formed on the dielectric liner 181. In some embodiments, the dielectric liner 181 may be deposited in the recesses 322. The dielectric liner 181 may be formed of any suitable material, and in some embodiments includes one or more of SiO, SiOC, $Al_2O_3$, AlON, ZrO, HfO, TiO, ZrAlO, ZnO, SiOCN, SiOCN, SiCN.

The dielectric liner 181 may be etched to remove a bottom portion and top portions of the sidewalls of the dielectric liner 181, thus at least partially exposing one or more of the source/drain regions 194. The source/drain contacts 340 may be formed by forming a first metal layer, for example, at a lower portion 371 of the source/drain contacts 340. The silicide layer 348 may then be formed, for example, by an annealing process in which the first metal layer reacts with the semiconductor material of the source/drain regions 194 to form the silicide layer 348. A second metal layer may be formed on the first metal layer, for example, at an upper portion 372 of the source/drain contacts 340. In some embodiments, the first and second metal layers are formed of different materials or different metals.

As shown in FIG. 2P, backside metallization structures are formed at the backside 311 of the device 100. The backside metallization structures may include, for example, electrical contacts, conductive lines, any other conductive features, and may further include one or more electrically insulating layers. In some embodiments, the backside metallization structures includes a hard mask layer 342 and an etch stop layer 344. Backside metal contacts 346 may be formed, for example, by patterning of the hard mask layer 342 utilizing the etch stop layer 344, for example, to define openings. The backside metallization structures, such as the backside metal contacts 346, may be formed by deposition of a conductive or metal material in the openings. FIG. 2P illustrates an embodiment where portions of dielectric layer 310 have not been partially removed as described above with reference to FIG. 2J and remains under isolation structures 226 in FIG. 2P.

The backside contacts 346 may be electrically connected or coupled to one or more electrical contacts of the transistors 104 of the device 100. For example, in some embodiments, the backside contacts 346 are electrically connected to one or more of the backside source/drain contacts 340 or the gate electrodes 216.

Figure 3A:
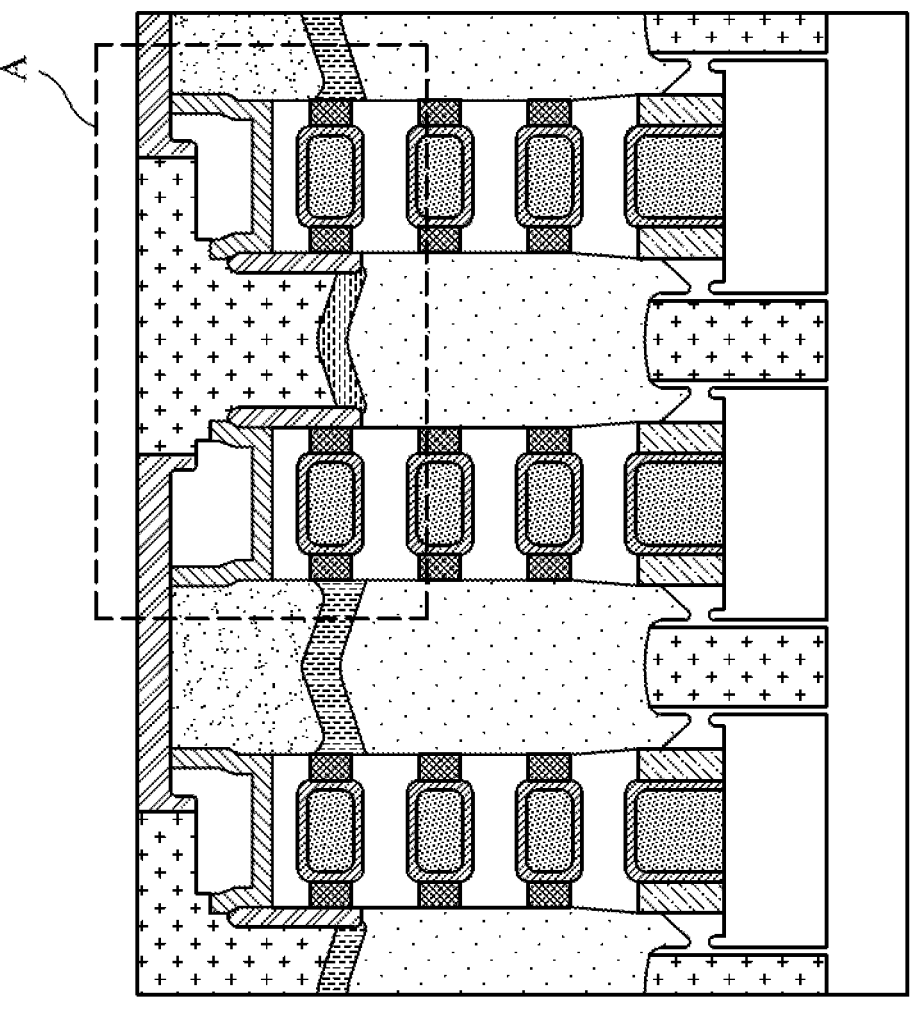
FIG. 3A is a cross-sectional view of a semiconductor device, in accordance with some embodiments.
Figure 3B:
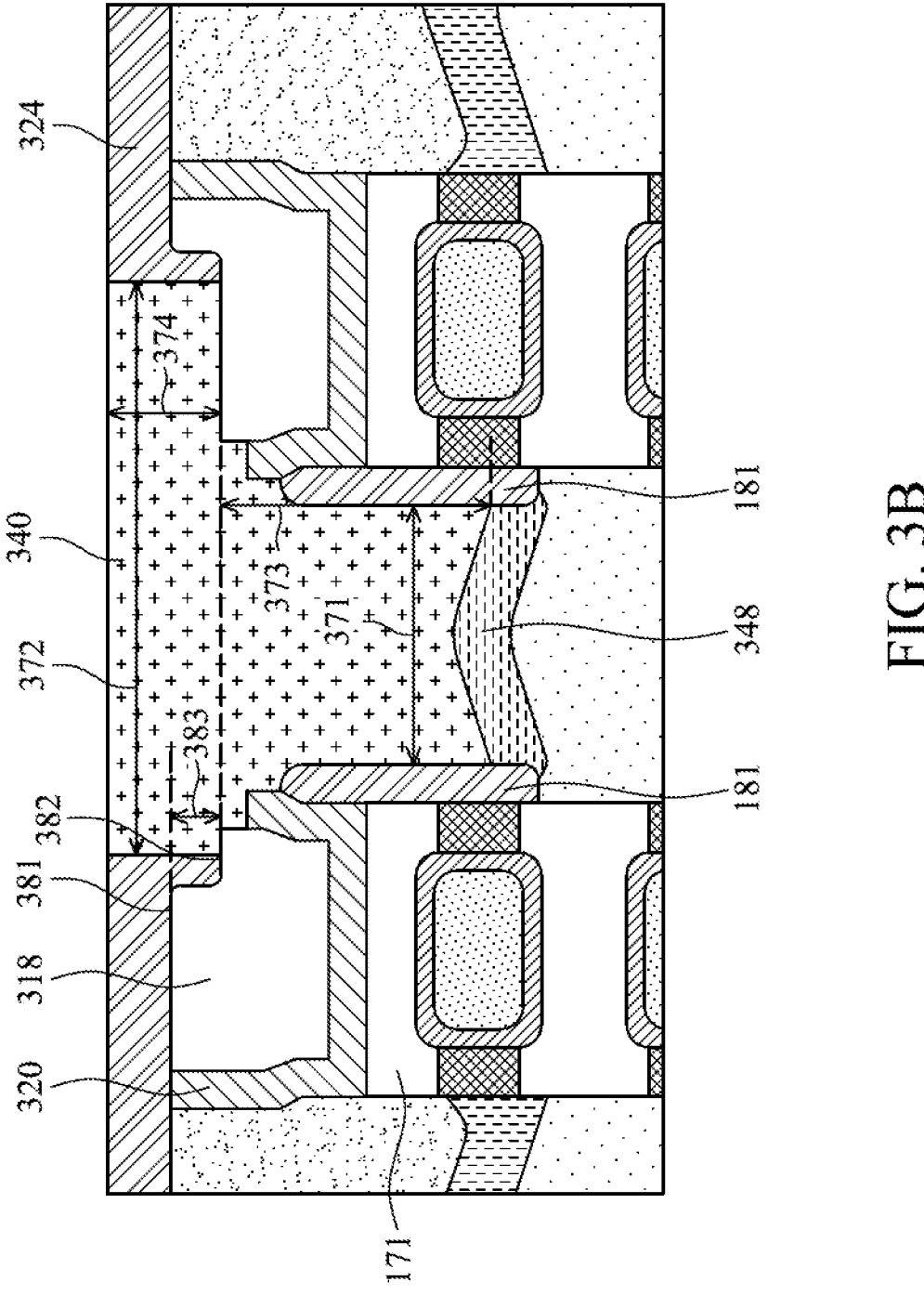
FIG. 3B is a cross-sectional view illustrating an enlarged region of the semiconductor device shown in FIG. 3A.

FIG. 3A is a cross-sectional view showing a portion of the semiconductor device 100, for example, as shown in FIG. 2O, and FIG. 3B is a cross-sectional view illustrating an enlarged region "A" of the semiconductor device 100 shown in FIG. 3A.

As shown in FIG. 3B, the source/drain contacts 340 may have a two-tier structure in which a first portion (e.g., the lower portion) has a first width 371 that is less than a second width 372 of a second portion (e.g., the upper portion). In some embodiments, the first width 371 is within a range of 5 nm to 30 nm, and the second width 372 is within a range of 10 nm to 60 nm. In some embodiments, the second width 372 is at least two times greater than the first width 371.

In some embodiments, the first portion (e.g., the lower portion) of the source/drain contact 340 has a first height 373 and the second portion (e.g., the upper portion) has a second height 374. In some embodiments, the first height 373 is within a range of 5 nm to 30 nm, and the second height 374 is within a range of 5 nm to 30 nm. In some embodiments, the first height 373 is greater than the second height 374.

In some embodiments, the first portion (e.g., the lower portion) of the source/drain contact 340 may be formed of a different material (e.g., a different metal or conductive material) than the second portion (e.g., the upper portion) of the source/drain contact 340.

In some embodiments, the silicide layer 348 may have a thickness within a range of 1 nm to 10 nm. In some embodiments, the silicide layer 348 may include one or more of: TiSi, CrSi, TaSi, MoSi, ZrSi, HfSi, ScSi, Ysi, HoSi, TbSI, GdSi, LuSi, DySi, ErSi, or YbSi, for example, where the source/drain regions 194 are formed of N-type materials. In some embodiments, the silicide layer 348 may include one or more of: NiSi, CoSi, MnSi, Wsi, FeSi, RhSi, PdSi, RuSi, PtSi, IrSi, OsSi, for example, where the source/drain regions 194 are formed of P-type materials.

In some embodiments, the dielectric liner 181 may have a thickness, e.g., in the horizontal direction of FIG. 3B that is within a range of 0 to 10 nm.

As shown in FIG. 3B, in some embodiments, the sacrificial dielectric layer 318 may be at least partially recessed, for example, with a first surface 381 and a second surface 382 that is vertically recessed with respect to the first surface 381. A height or distance 383 between the first and second surfaces 381, 382 may be within a range of 0 nm to 20 nm. The sacrificial dielectric layer 318 may be recessed, for example, due to the etching to form the openings 326. In some embodiments, the sacrificial dielectric layer 318 has a substantially planar or non-recessed upper surface.

Figure 3C:
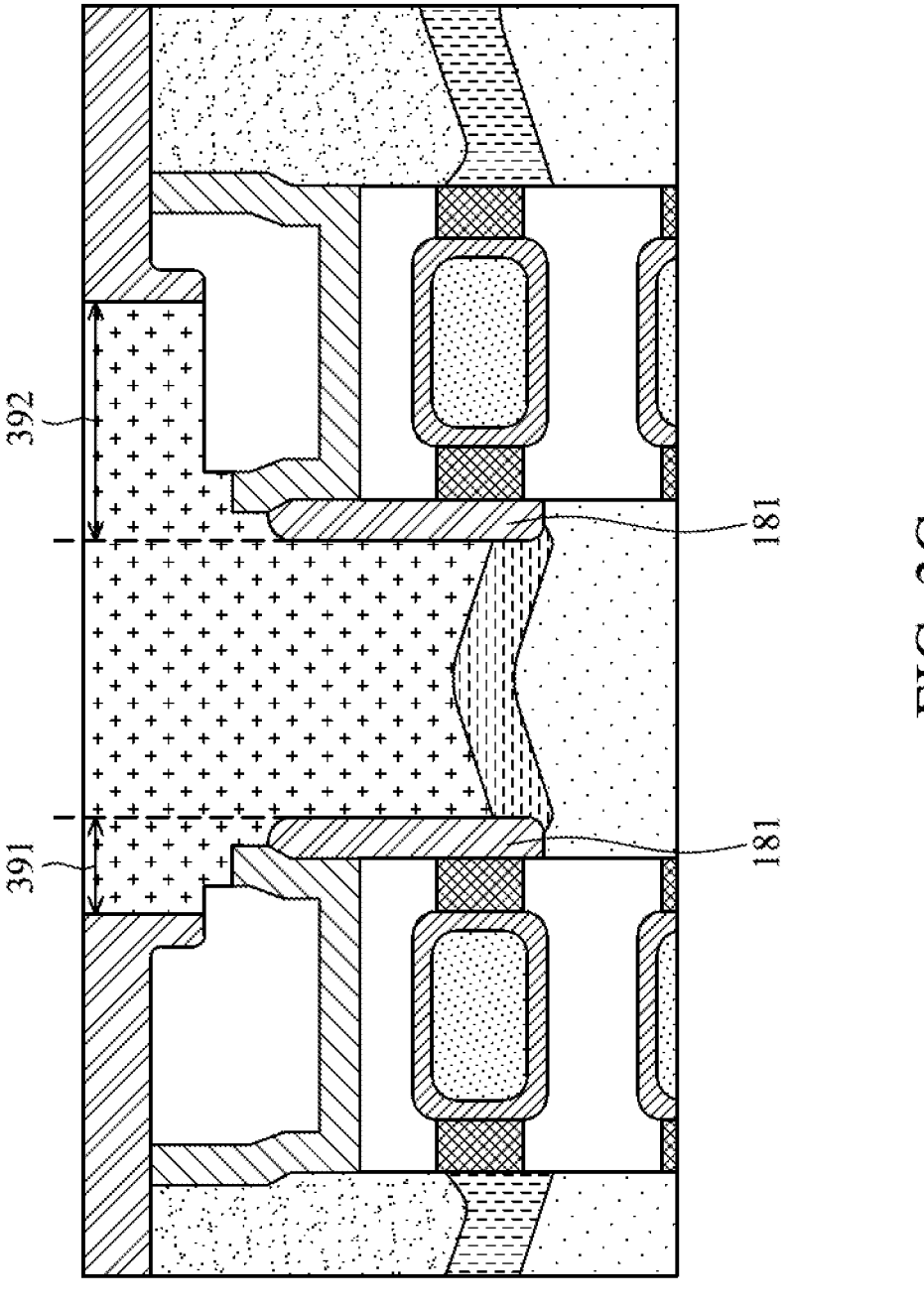
FIG. 3C is a cross-sectional view illustrating additional features of the semiconductor device shown in FIG. 3B, in accordance with some embodiments

FIG. 3C is a cross-sectional view illustrating additional features of the semiconductor device 100 shown in FIG. 3B, in accordance with some embodiments. As shown in FIG. 3C, the upper portion of the source/drain contact 340 may extend laterally by a first distance 391 between an edge of the dielectric liner 181 and an edge of the hard mask layer 324 at a first side of the source/drain contact 340. Similarly, the upper portion of the source/drain contact 340 may extend laterally by a second distance 392 between an edge of the dielectric liner 181 and an edge of the hard mask layer 324 at a second side of the source/drain contact 340. In some embodiments, each of the first and second distances 391, 392 is within a range of 5 nm to 40 nm. In some embodiments, the first and second distances 391, 392 are different. In some embodiments, a difference between the first and second distances 391, 392 is within a range of 0 to 10 nm, which may result due to overlay characteristics or overlay shift of photolithographic processes or tools utilized in forming the source/drain contacts 340.

Figure 4:
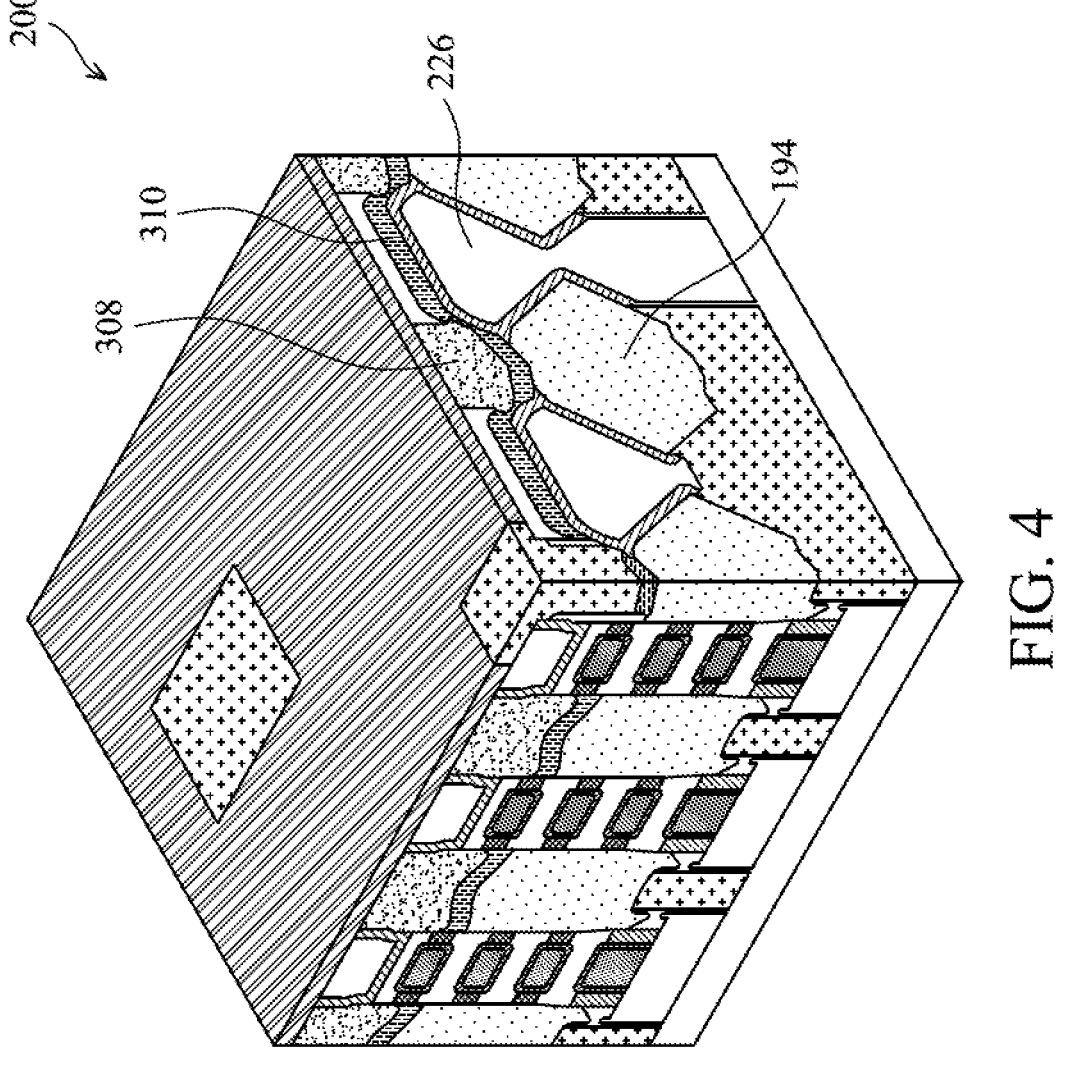
FIG. 4 is a perspective view of a semiconductor device, in accordance with some embodiments.

FIG. 4 is a perspective view of a semiconductor device 200, in accordance with some embodiments. The semiconductor device 200 of FIG. 4 is substantially the same or similar to the semiconductor device 100 shown in FIG. 2O except that the dielectric layer 310 extends over the isolation structures 226 and the semiconductor regions 308 (e.g., between the source/drain regions 194 and the semiconductor regions 308). In contrast, as described herein with respect to the semiconductor device 100 of FIG. 2O, portions of the dielectric layer 310 may be removed so that only portions of the dielectric layer 310 on the semiconductor regions 308 remain. In some embodiments, the dielectric layer 310 may be omitted or may be completely removed.

The semiconductor device 200 may be further processed to include backside metallization structures, for example, as shown in FIG. 2P.

Figure 5:
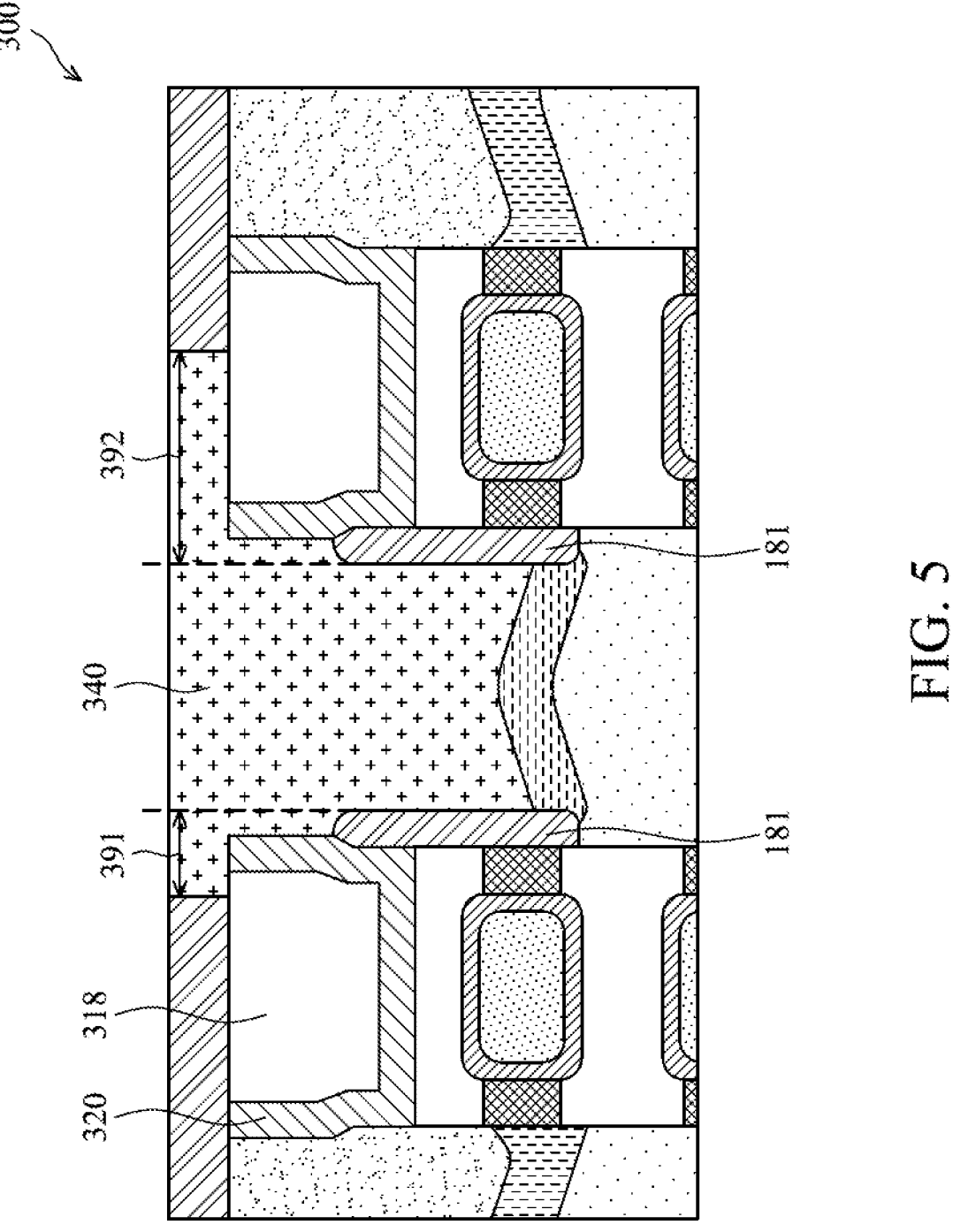
FIG. 5 is a cross-sectional view showing a portion of a semiconductor device, in accordance with some embodiments.

FIG. 5 is a cross-sectional view showing a portion of a semiconductor device 300, in accordance with some embodiments. The semiconductor device 300 of FIG. 5 is substantially the same or similar to the semiconductor device 100, for example, as shown in FIG. 3C except that the liner 320 and the sacrificial dielectric layer 318 are not partially removed in the semiconductor device 300. For example, the liner 320 and the sacrificial dielectric layer 318 of the semiconductor device 300 are not partially recessed or removed at inner portions of the source/drain contact 340 during processing (e.g., etching) to form the openings 326. In the embodiment of FIG. 5, similar to the embodiment of FIG. 3C, the dielectric liner 181 has not been recessed.

Figure 6:
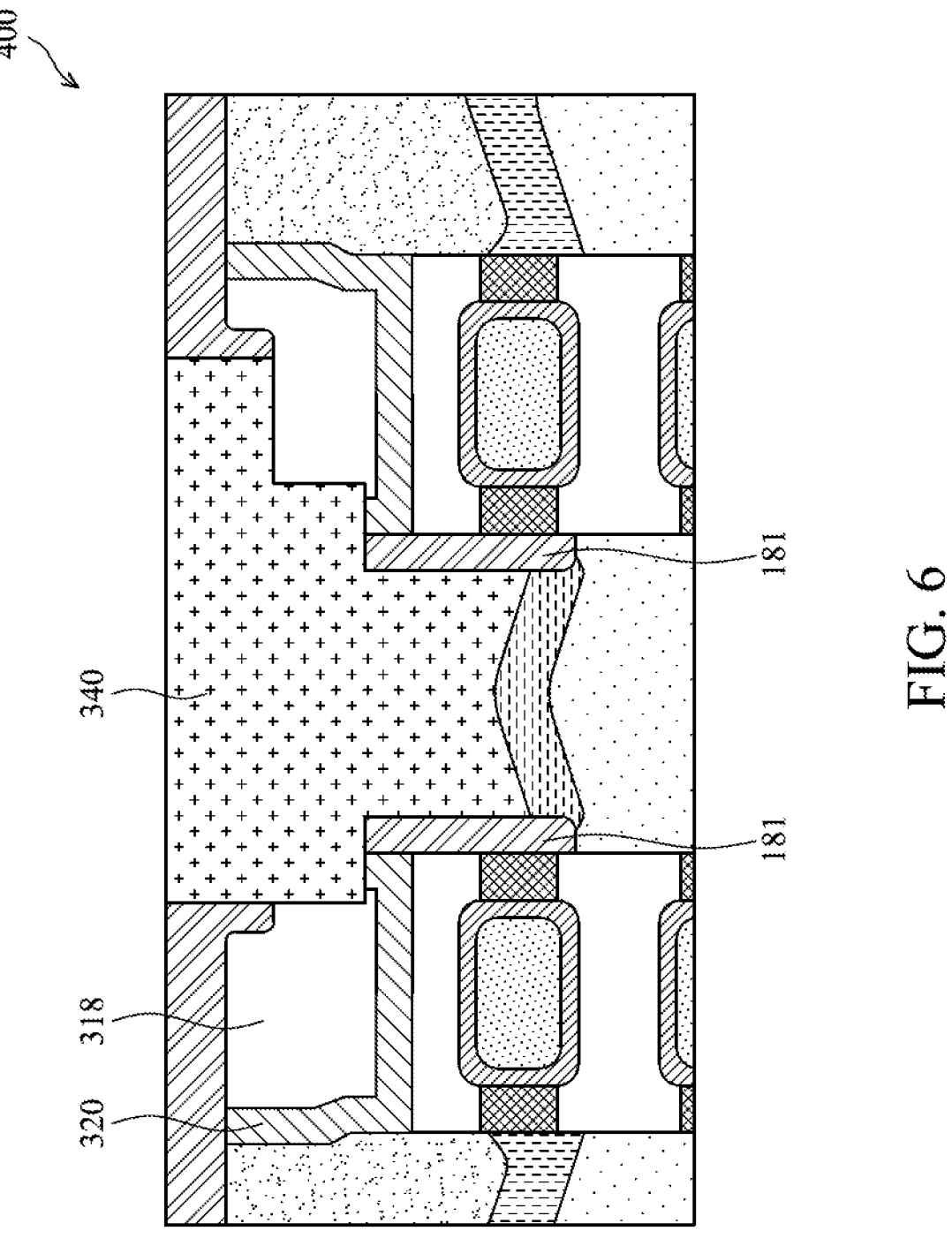
FIG. 6 is a cross-sectional view showing a portion of a semiconductor device, in accordance with some embodiments.

FIG. 6 is a cross-sectional view showing a portion of a semiconductor device 400, in accordance with some embodiments. The semiconductor device 400 of FIG. 6 is substantially the same or similar to the semiconductor device 100, for example, as shown in FIG. 3C except that side portions of the sacrificial dielectric layer 318 are removed in the semiconductor device 400. That is, the sacrificial dielectric layer 318 of the semiconductor device 400 has a width that is less than that of the sacrificial dielectric layer 318 of the semiconductor device 100 shown in FIG. 3C. The side walls or side portions of the sacrificial dielectric layer 318 may be removed, for example, during processing (e.g., etching) to form the openings 326.

Further, as shown in FIG. 6, inner sidewalls of the liner 320 may be removed at the interface with the source/drain contact 340. For example, as shown in FIG. 6, the liner 320 may have only an outer side and a lower side, with the inner side being completely removed. Also as illustrated in FIG. 6, upper portions of dielectric liner 181 may be removed. In some embodiments, an upper surface of dielectric liner 181 is coplanar with an upper surface of a portion of liner 320 adjacent to dielectric liner 181. The inner sidewalls of liner 320 and the upper portion of dielectric liner 181 may be removed, for example, during processing (e.g., etching) to form the openings 326.

Embodiments of the present disclosure provide semiconductor devices and methods of manufacturing semiconductor devices that include backside self-aligned source/drain contacts which fully land on or contact epitaxial source/drain regions. Sacrificial dielectric structures or layers are formed on gate regions or on metal gate electrodes and protect or otherwise reduce or prevent damage to the gate regions during formation of the backside source/drain contacts, for example, during an etching process which may be employed to form the backside source/drain contacts. The inclusion of the sacrificial dielectric structures facilitates enlarging of a patterning window or opening that is formed in a hard mask or other layer as part of the process of forming the backside source/drain contacts, as an etching process may be employed that selectively removes underlying portions of semiconductor regions while retaining the sacrificial dielectric structures.

In some embodiments, a semiconductor device includes a first dielectric layer and a first plurality of nanostructures on the first dielectric layer. The first plurality of nanostructures overlie one another. A first source/drain region is disposed laterally adjacent to a first side of the first plurality of nanostructures, and a second dielectric layer is disposed on a first side of the first source/drain region. A front side source/drain contact is disposed on a second side of the first source/drain region that is opposite the first side. A backside source/drain contact is disposed on the first side of the first source/drain region, with the backside source/drain contact extending through the second dielectric layer.

In some embodiments, a device includes a channel region and a first source/drain region disposed laterally adjacent to a first side of the channel region. A second source/drain region is disposed laterally adjacent to a second side of the channel region that is opposite the first side. A gate electrode at least partially surrounds the channel region. A dielectric layer is disposed on a first side of the first source/drain region. A front side source/drain contact is disposed on a second side of the first source/drain region that is opposite the first side. A backside source/drain contact has a first portion on the first side of the first source/drain region, and a second portion on the first portion. The second portion has a greater width than the first portion.

In some embodiments, a method includes forming a channel region of a transistor overlying a first dielectric layer. A source/drain region is formed laterally adjacent to a first side of the channel region. A second dielectric layer is formed on a first side of the source/drain region. A front side source/drain contact is formed on a second side of the source/drain region that is opposite the first side. A backside source/drain contact is formed on the first side of the source/drain region, with the backside source/drain contact extending through the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first source/drain region;
a second source/drain region;
a plurality of stacked first nanostructures extending laterally between the first source/drain region and the second source/drain region;
a first dielectric structure below the first nanostructures;
a dielectric liner layer on sidewalls of the first dielectric structure and on a top surface of the first dielectric structure between the first dielectric structure and the first plurality of nanostructures;
a semiconductor structure below the second source/drain region, wherein the dielectric liner layer is positioned between a sidewall of the first dielectric structure and the semiconductor structure;
a dielectric layer on a top surface of the semiconductor structure between the semiconductor structure and the second source/drain region;
a front side source/drain contact above and electrically coupled to the first source/drain region; and
a backside source/drain contact below and electrically coupled to the first source/drain region, the dielectric liner layer positioned between a portion of the first dielectric structure and the backside source/drain contact.

2. The device of claim 1,
wherein the backside source/drain contact has a lower portion and an upper portion, the upper portion disposed between the first source/drain region and the lower portion, and the lower portion has a width that is greater than a width of the upper portion.

3. The device of claim 2, wherein the lower portion of the backside source/drain contact is in contact with a backside of the first dielectric structure.

4. The device of claim 3, wherein the lower portion of the source/drain contact is in contact with the dielectric liner layer.

5. The device of claim 2, wherein the lower portion of the backside source/drain contact includes a first metal, and the upper portion of the backside source/drain contact includes a second metal that is different than the first metal.

6. The device of claim 2, wherein the width of the lower portion of the backside source/drain contact is within a range of 5 nm to 30 nm, and the width of the upper portion of the backside source/drain contact is within a range of 10 nm to 60 nm.

7. The device of claim 2, wherein each of the lower portion and the upper portion of the backside source/drain has a height within a range of 5 nm to 30 nm.

8. The device of claim 1, further comprising a silicide layer between the first source/drain region and the backside source/drain contact.

9. The device of claim 1, wherein the dielectric liner layer includes a first side portion in contact with the backside source/drain contact and a second side portion opposite the first side portion, wherein the first side portion has a height that is less than a height of the second side portion.

10. The device of claim 1, further comprising a trench isolation structure having a bottom surface at a vertical level lower than a top surface of the backside source/drain contact.

11. A device, comprising:

a first source/drain region;

a second source/drain region;

a channel region extending laterally between the first source/drain region and the second source/drain region;

a gate electrode at least partially surrounding the channel region;

a semiconductor structure below the second source/drain region;

a dielectric layer between the semiconductor structure and the second source/drain region;

a front side source/drain contact above and electrically coupled to the first source/drain region; and a backside source/drain contact below and electrically coupled to the first source/drain region and having an upper portion adjacent to the first source/drain region and a lower portion below the upper portion and having a greater width than the upper portion; and a dielectric structure below the channel and the gate electrode and laterally between the upper portion of the backside source/drain contact and the semiconductor structure, wherein a top surface of the dielectric structure is lower than a top surface of the backside source/drain contact and lower than the dielectric layer.

12. The device of claim 11, wherein the lower portion of the backside source/drain contact laterally contacts the dielectric structure.

13. The device of claim 11, wherein the upper and lower portions of the backside source/drain contact are formed of different conductive materials.

14. The device of claim 11, further comprising a silicide layer between the upper portion of the backside source/drain contact and the first source/drain region.

15. The device of claim 11, wherein the channel and the semiconductor structure are different semiconductor materials.

16. The device of claim 15, wherein the channel is silicon and the semiconductor structure is silicon germanium.

* * * * *